United States Patent
Takebayashi et al.

(10) Patent No.: US 8,193,629 B2
(45) Date of Patent: Jun. 5, 2012

(54) BONDING STRUCTURE FOR A TERMINAL OF A SUSCEPTOR OF A SEMICONDUCTOR DEVICE MANUFACTURING APPARATUS

(75) Inventors: Hiroshi Takebayashi, Nagoya (JP); Taichi Nakamura, Nagoya (JP); Tomoyuki Fujii, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 401 days.

(21) Appl. No.: 12/350,314

(22) Filed: Jan. 8, 2009

(65) Prior Publication Data
US 2009/0176065 A1 Jul. 9, 2009

(30) Foreign Application Priority Data
Jan. 8, 2008 (JP) ................. 2008-001367

(51) Int. Cl.
 *B32B 3/00* (2006.01)
(52) U.S. Cl. ........ 257/690; 257/774; 257/773; 257/780; 257/779; 257/783; 428/173; 428/172; 428/621; 219/200; 219/544; 219/444.1
(58) Field of Classification Search ............ 257/690, 257/773, 774, 780, 779, 783, 684, 701, 702, 257/703, 704, 705, 729, 730, 621; 156/379.6; 428/173, 172, 621; 219/200, 544, 444.1
See application file for complete search history.

(56) References Cited

U.S. PATENT DOCUMENTS

| | | | |
|---|---|---|---|
| 5,995,357 A | 11/1999 | Ushikoshi et al. | |
| 6,486,542 B1* | 11/2002 | Ohashi et al. | 257/684 |
| 6,857,556 B2* | 2/2005 | Ishikawa et al. | 228/122.1 |
| 7,388,296 B2* | 6/2008 | Urashima et al. | 257/779 |
| 7,564,008 B2* | 7/2009 | Mori et al. | 219/444.1 |
| 7,800,029 B2* | 9/2010 | Nishioka | 219/544 |
| 2005/0007718 A1* | 1/2005 | Stevenson et al. | 361/118 |
| 2006/0037857 A1* | 2/2006 | Natsuhara et al. | 204/297.06 |
| 2006/0169688 A1 | 8/2006 | Mori et al. | |
| 2007/0146961 A1 | 6/2007 | Morioka et al. | |
| 2008/0116187 A1* | 5/2008 | Sugimoto et al. | 219/200 |
| 2009/0173448 A1* | 7/2009 | Fujii et al. | 156/379.6 |
| 2009/0173449 A1* | 7/2009 | Nakamura et al. | 156/379.6 |

FOREIGN PATENT DOCUMENTS

| | | |
|---|---|---|
| CN | 1988128 A | 6/2007 |
| JP | 3790000 B2 | 4/2006 |
| TW | 200625509 A | 7/2006 |

* cited by examiner

Primary Examiner — A O Williams
(74) Attorney, Agent, or Firm — Burr & Brown

(57) ABSTRACT

A bonding structure including: a ceramic member made of aluminum nitride and including a hole; a terminal embedded in the ceramic member, exposed to a bottom surface of the hole, and made of molybdenum; a brazed bond layer consisting of gold (Au) only; and a connecting member inserted in the hole, bonded to the terminal via the brazed bond layer, and made of molybdenum.

3 Claims, 15 Drawing Sheets

BONDING STRUCTURE FOR A TERMINAL OF A SUSCEPTOR OF A SEMICONDUCTOR DEVICE MANUFACTURING APPARATUS

CROSS REFERENCE TO RELATED APPLICATION

This application is based upon and claims the benefit of priority from prior Japanese Patent Application No. 2008-001367, filed on Jan. 8, 2008; the entire contents of which are incorporated herein by reference.

BACKGROUND OF THE INVENTION

1. Field of the Invention

The present invention relates to bonding structures and semiconductor device manufacturing apparatuses. More specifically, the present invention relates to a bonding structure for bonding a connecting member to a metal terminal embedded in a ceramic member, a bonding structure including a connecting member for supplying an electric power to an electrode embedded in a ceramic member, and a semiconductor device manufacturing apparatus having this bonding structure.

2. Description of the Related Art

Semiconductor wafer susceptors such as an electrostatic chuck in which an electrode is embedded in a ceramic member are used in the field of semiconductor device manufacturing apparatuses such as an etching apparatus, a CVD apparatus or the like. Examples of the semiconductor wafer susceptors include: a semiconductor wafer susceptor in which an electrode is embedded in a base material such as aluminum nitride or dense alumina, and is configured to function as a discharge electrode for generating plasma; a semiconductor wafer susceptor which includes metal resistors (heater) embedded in a base material such as aluminum nitride or alumina, and is configured to function as a ceramic heater for controlling the temperature of a wafer in a heat treatment processing such as CVD, or the like. In addition, some semiconductor wafer susceptors have electrodes embedded in the base materials and function as electrostatic chucks configured to chuck and hold semiconductor wafers in the process of wafer transfer, an exposure, a film forming such as CVD and sputtering, a micro-processing, a cleansing, an etching, a dicing, and the like.

In these apparatuses, an electrode embedded in the ceramic base material such as aluminum nitride needs to be electrically connected to a connecting member. The portion connecting the electrode and the connecting member is subjected to heat cycles of extremely high and low temperatures in an oxidizing atmosphere and further in a corrosive gas atmosphere. Even in such severe conditions, the portion connecting the electrode and the connecting member is required to maintain a high bonding strength and a suitable electrical connection for a long period of time.

In order to solve these problems, some techniques have been proposed (see Japanese Patent Publication No. 3790000, for example). Nevertheless, problems remain yet to be solved in these proposed techniques.

For example, when an electrode connecting part is produced for a semiconductor wafer susceptor as a semiconductor device manufacturing apparatus, a connecting member and a terminal embedded in a ceramic member are bonded together with a brazed bond layer interposed in between. In general, an Au (gold)-Ni (nickel) solder Alloy is used for the brazed bond layer. However, there has been a problem in which the bonded portion is vulnerable and tends to break, after the connecting member and the terminal are bonded via the brazed bond layer. In order to solve this problem, a thicker brazing material layer (whose thickness is stably 200 μm or more) is used, or a chromium (Cr) film is provided to prevent diffusion of Ni. However, the problems have not been solved completely.

Further, a screw hole is provided in the connecting member, and a power supplying member for supplying the power to the connecting member is screwed into the screw hole. The connecting member and the power supplying member is thus connected to each other. Thus, when torque is applied more than necessary on the power supplying member, a load is applied on the connecting portion that connects the connecting member and the terminal embedded in the ceramic member, thereby the connecting portion tends to break.

Further, when the ceramic member is to be fixedly bonded with another part that contacts the ceramic member, some conventional apparatuses include a seating hole in the ceramic member, and a molybdenum metal member provided with a female screw is subjected to an aluminum (Al) brazing. However, since the melting point of brazed Al is low, the boding strength decreases at a temperature of 400° C. or higher. Thus, such a bonding structure cannot be used at high temperatures.

Accordingly, a reliable bonding structure for bonding the connecting member and the terminal embedded in the ceramic member, a semiconductor device manufacturing apparatus including this bonding structure, and a semiconductor wafer susceptor including this bonding structure have been awaited.

SUMMARY OF THE INVENTION

A first aspect of the present invention is summarized as a bonding structure, including: a ceramic member made of aluminum nitride and including a hole; a terminal embedded in the ceramic member, exposed to a bottom surface of the hole, and made of molybdenum; a brazed bond layer consisting of gold (Au) only; and a connecting member inserted in the hole, bonded to the terminal via the brazed bond layer, and made of molybdenum.

A second aspect of the present invention is summarized as a semiconductor device manufacturing apparatus that includes the bonding structure according to the first aspect.

DETAILED DESCRIPTION OF THE INVENTION

Figure 1A:
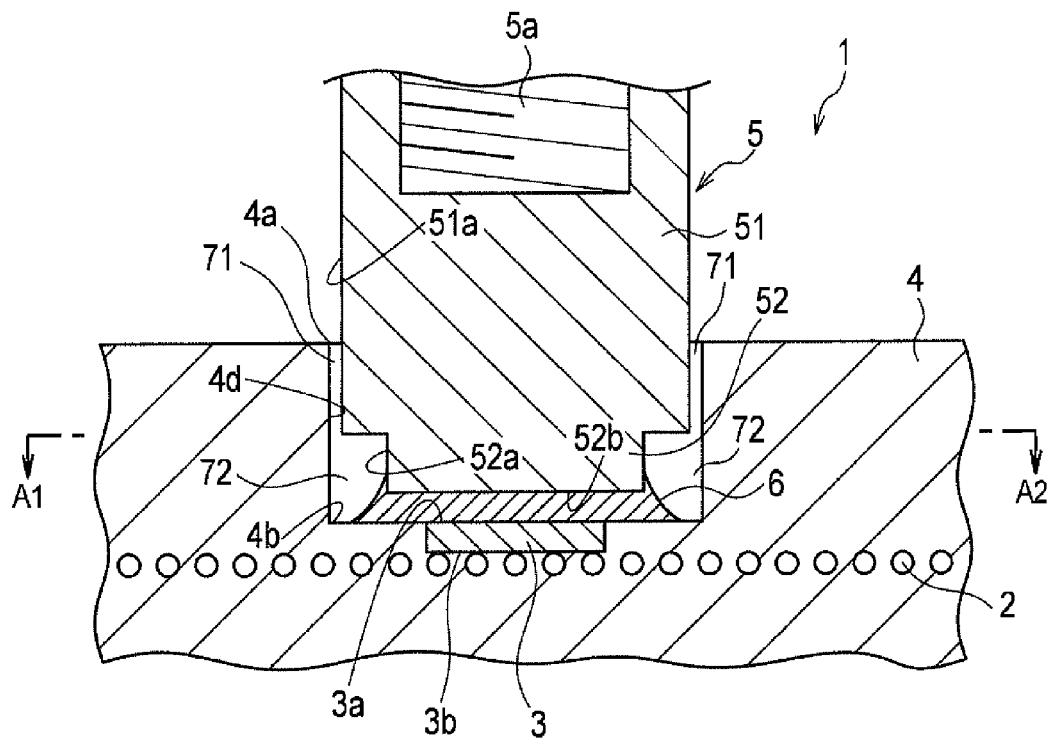
FIG. 1A is a schematic, cross-sectional view of a semiconductor wafer susceptor according to the first embodiment, which is vertical to the main surface of the ceramic member included in the semiconductor wafer susceptor.

Descriptions will be provided hereinafter for the present invention by citing the embodiments of the present invention. Note that the present invention is not limited to the following embodiments. Throughout the drawings, components having the same or similar functions will be denoted by the same or similar reference numerals, and descriptions thereof will be omitted.

With reference to the drawings, detailed description will be given below for an embodiment of the present invention. Note that, in the following description of the drawings, the same or similar parts will be denoted by the same or similar reference numerals.

However, it should be noted that the drawings are schematic and ratios of dimensions and the like are different from actual ones. Therefore, specific dimensions and the like should be determined by taking into consideration the following description. Moreover, as a matter of course, also among the drawings, there are included portions in which dimensional relationships and ratios are different from each other.

The First Embodiment

Semiconductor Wafer Susceptor (Bonding Structure)

Figure 1B:
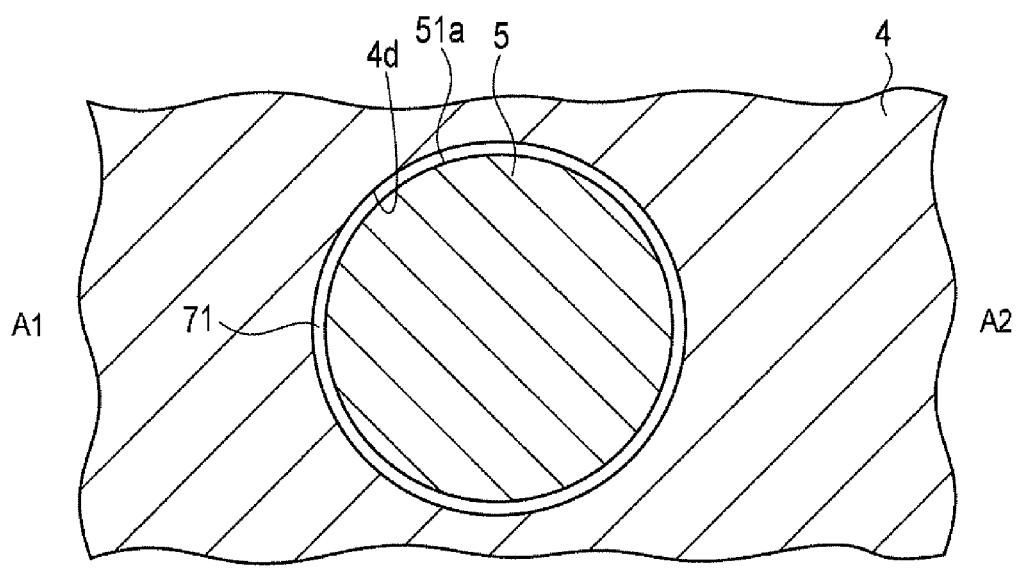
FIG. 1B is a schematic, cross-sectional view of the semiconductor wafer susceptor according to the embodiment, which is parallel with the main surface of the ceramic member included in the semiconductor wafer susceptor.

FIG. 1A is a schematic, cross-sectional view of a semiconductor wafer susceptor according to the first embodiment, which is vertical to the main surface of the ceramic member included in the semiconductor wafer susceptor according to the first embodiment. FIG. 1B is a schematic, cross-sectional view of the semiconductor wafer susceptor according to the first embodiment, which is parallel with the main surface of the ceramic member included in the semiconductor wafer susceptor according to the first embodiment. Note that the descriptions for the semiconductor wafer susceptor according to the first embodiment constitute descriptions for a bonding structure and a semiconductor device manufacturing apparatus including the bonding structure.

The semiconductor wafer susceptor according to the first embodiment is made of aluminum nitride and includes: a ceramic member 4, a terminal 3, and a so brazed bond layer 6 connecting the terminal 3 and the connecting member 5. The ceramic member 4 includes a hole 4a on the upper surface. The ceramic member 4 includes heater resistors 2 embedded therein, as a conductive layer. The heater resistors 2 are embedded in parallel with the surface of the ceramic member 4.

The terminal 3 is made of a refractory metal having a thermal expansion coefficient substantially equal to a thermal expansion coefficient of the ceramic member 4. The terminal 3 is made of molybdenum, and is embedded in the bottom surface of the hole 4a, The terminal includes a first main surface 3a and a second main surface 3b. The first main surface 3a is exposed to the bottom of the hole 4a, and the second main surface 3b electrically contacts the heater resistors 2.

The brazed bond layer 6 is made of gold (Au) only, and contacts with the first surface 3a that is an exposed surface of the terminal 3.

The connecting member 5 is inserted in the hole 4a, and is bonded to the terminal 3 with the brazed bond layer 6 interposed in between. The connecting member 5 is made of the refractory metal having the thermal expansion coefficient substantially equal to the thermal expansion coefficient of the ceramic member 4. The connecting member 5 is made of molybdenum.

The connecting member 5 includes a body portion 51, and an end portion 52 connected to the body portion 51. The end portion 52 includes a bonding surface 52b that contacts with the bottom surface 4b of the hole 4a, via the brazed bond layer 6. The bonding surface 52b and the bottom surface 4b of the hole 4a are substantially parallel to each other. A space 72 (hereinafter referred to as a clearance), which is formed between the side surface 52a of the end portion 52 and the surface 4d of the hole 4a, is larger than a clearance 71 formed between the side surface 51a of the body portion 51 and the surface 4d of the hole 4a.

This formation of the clearance 71 enables the connecting member 5 to be inserted into the hole 4a. In addition, the formation of the clearance 71 enables the connecting member 5 inserted in the hole 4a to thermally expand. The clearance 71 may be formed on the whole circumference of the connecting member 5. Alternatively, a part of the surface of the connecting member 5 may be in contact with the surface 4d of the hole 4a. Actually, the clearance 71 is formed in at least any part around the connecting member 5.

It is preferable that the clearance 71 should be wider than 0 mm, but not wider than approximately 0.5 mm. When the clearance 71 is narrower than the lower limit, the connecting member 5 cannot be inserted in the hole 4a. On the contrary, when the diameter of the hole 4a is too large, impurities tend to enter the clearance 71, and thereby causing a contamination or electrode corrosion. A hole 4a larger than necessary need not be formed in the ceramic member, since the strength of the ceramic member 4 decreases as the hole 4a formed in the ceramic member 4 becomes larger in size. In addition, the clearance 71 is expected to play a function of guiding the insertion of the connecting member 5 into the hole 4a.

When the clearance 71 is formed in a small size, a part of the circumference of the connecting member 5 contacts with the surface 4d of the hole 4a of the ceramic member with high possibilities. Accordingly, even when a load is applied on the connecting member 5 to the direction crossing the longitudinal direction of the connecting member, the hole 4a of the ceramic member 4 can support the connecting member 5. Therefore, the breakage in the connecting portion between the connecting member 5 and the terminal 3 can be prevented.

The clearance 72 is larger than the clearance 71. More specifically, when the diameter of the bonding surface 52b is set not less than 4 mm but not more than 6 mm, the diameter of the bottom surface 4b of the hole 4a is 1 to 1.5 mm larger than the diameter of the bonding surface 52b. Note that, the thickness of the brazed bond layer 6, which is a gold (Au) layer, is not less than 3 μm but not more than 10 μm.

The formation of the clearance 72 (i.e., relief space) between the side surface 52a of the end portion 52 and the surface 4d of the hole 4a enables the brazed bond layer 6 formed between the bottom surface 4b of the hole 4a and the bonding surface 52b of the connecting member 5 to be made thin.

The brazed bond layer 6 is formed by the braze foil 20 that is melted as described later. In this respect, when the large amount of the braze foil 20 used for forming the brazed bond layer is large, redundant braze material can flow into the clearance 72, In other words, the brazed bond layer 6 that contributes to connect the bonding surface 52b with the bottom surface 4b can be made thin.

Further, the thickness of the braze foil 20 (i.e., the amount of the braze material) can be adjusted to some extent in which the redundant (i.e., excess) braze material flows into the clearance 72. More specifically, when a part not covered by the braze material exists on the bonding surface 52b, a bonding failure may occur. Therefore, in the present embodiment, the redundant braze material availability can prevent the bonding failure. Accordingly, the thickness of the brazed bond layer 6 can set at not less than 3 μm but not more than 10 μm, even when the redundant braze material is used.

Figure 3A:
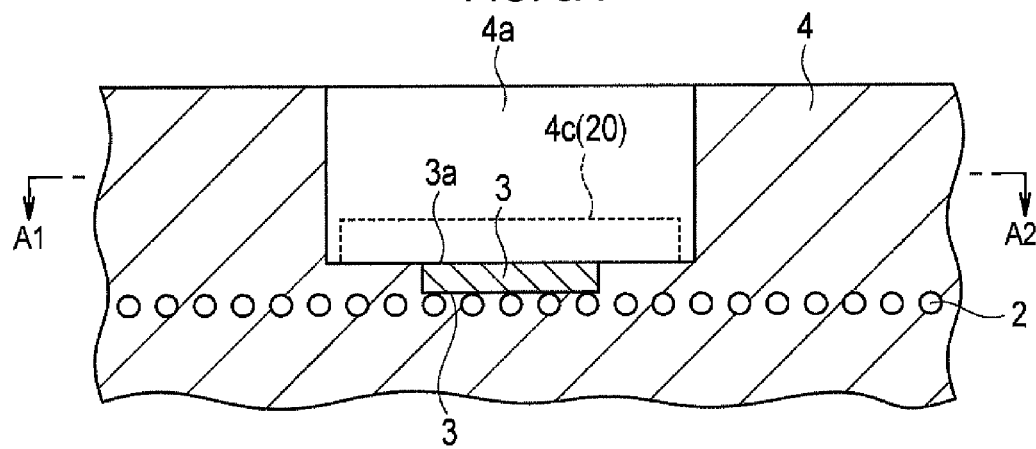
FIGS. 3A and 3B show processes of manufacturing the semiconductor wafer susceptor according to the first embodiment.
Figure 4:
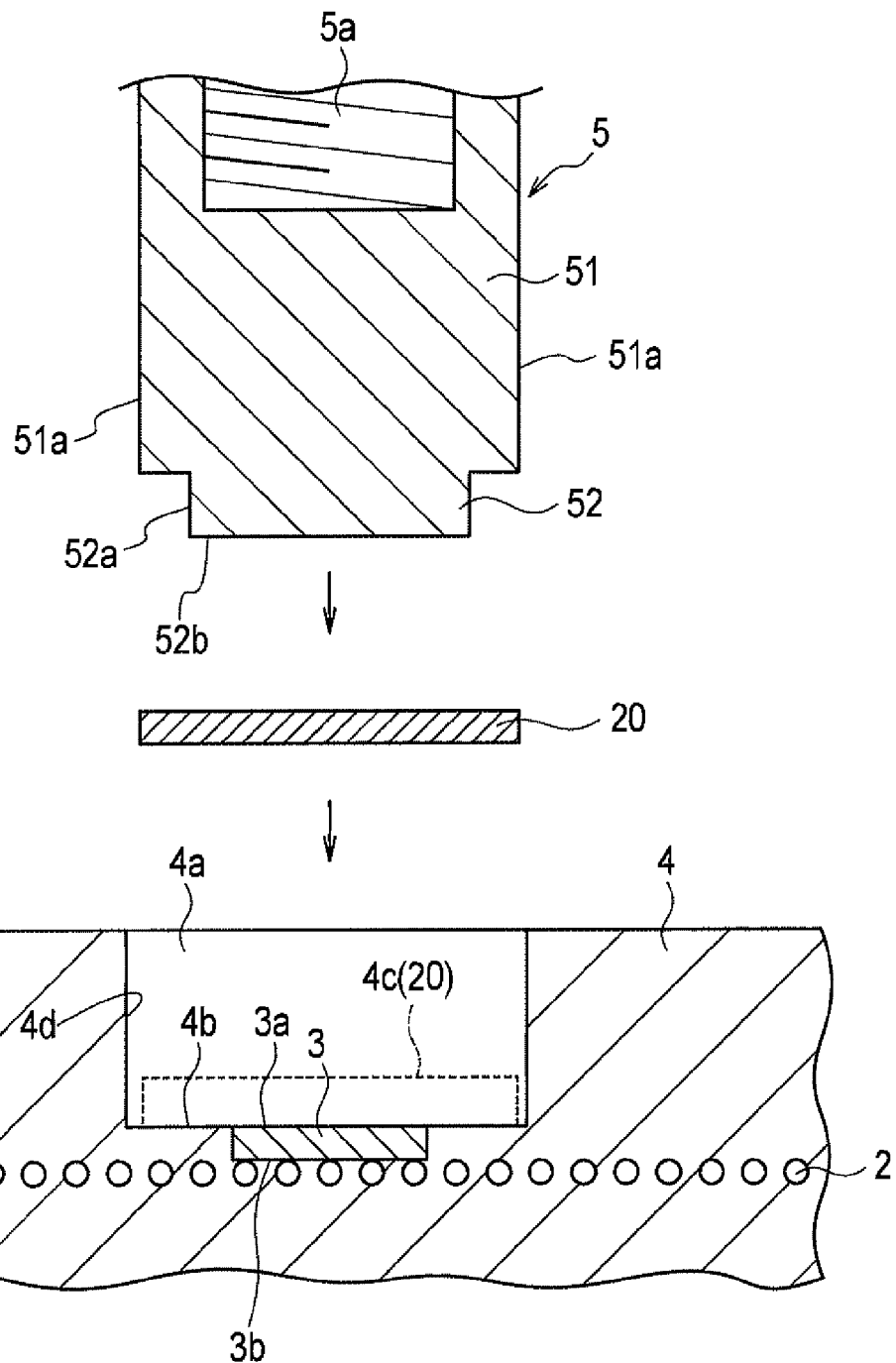
FIG. 4 shows a process of manufacturing the semiconductor wafer susceptor according to the first embodiment.

As shown in FIGS. 3A and 4, the braze foil 20 is formed between the bonding surface 52b of the end portion 52 of the connecting member 5 and the bottom surface 4b of the hole 4a to which the first main surface 3a of the terminal 3 is exposed. The braze foil 20 is formed in the first space 4c indicated with an imaginary line in FIG. 4. A spiral groove 5a is formed inside the body portion 51 of the connecting member 5. An end of the electrode having a corresponding spiral groove is screwed into the groove 5a, although the illustration of the electrode is omitted for easy understanding of the present invention. In this respect, the electrode is provided for supplying the electric power to the susceptor.

The material for the ceramic member 4 is not specifically limited. Examples of the material for the ceramic member 4 include alumina, aluminum nitride (AlN), trisilicon tetranitride ($Si_3N_4$) and boron nitride (BN). These compounds can be formed into a desired shape by sintering or the like.

It is preferable that the terminal 3 should be formed of a refractory metal having a thermal expansion coefficient close to the thermal expansion coefficient of the ceramic member 4. This is because the material for the terminal 3 is sintered together with a ceramic powder such as alumina powder or aluminum nitride powder, which is the material for the ceramic member 4, when the ceramic member 4 is manufactured. It is desirable to use a combination of alumina with any one of niobium and titanium, a combination of aluminum nitride with any one of molybdenum and platinum, or a combination of a combination of $Si_3N_4$ or boron nitride (BN) and tungsten.

Although the material for the terminal 3 is not limited to these combinations, use of the combination of aluminum nitride with molybdenum is particularly desirable. When aluminum nitride ceramics is used as the material for the ceramic member 4, molybdenum is preferably used. This is because the molybdenum has a thermal expansion coefficient close to the thermal expansion coefficient of the aluminum nitride ceramics, and molybdenum can be used as a bulk body which is capable of being embedded in the ceramic member 4, but which is large to a certain extent, when the aluminum nitride ceramics is sintered at a high melting point.

With regard to the material for the connecting member 5, it is preferable that the connecting member should be formed of a metal having a thermal expansion coefficient equal to the thermal expansion coefficient of the material for the terminal 3. This is because, while the connecting member 5 and the ceramic member 4 are directly brazed to each other, a difference in the thermal expansion of the materials tends to decrease the bonding strength between the connecting member 5 and the terminal 3, When the same material is used for both the connecting member 5 and the terminal 3, the difference in the stress is eliminated between the connecting member 5 and the terminal 3, and therefore the stress applied to the ceramic member 4 can be moderated.

From these viewpoints, it is particularly desirable to use molybdenum as the materials respectively for the connecting member 5 and the terminal 3 when the ceramic member 4 is formed of aluminum nitride Aluminum nitride is an insulating material that is highly heat-conductive and has a high strength. For this reason, aluminum nitride is the most suitable material to be used for the semiconductor wafer susceptor.

The diameter of the brazed bond layer 6 should preferably be set substantially equal to the diameter of the connecting member 5. It is desirable that the brazed bond layer 6 (i.e., the gold (Au) layer) should be set at not less than 3 μm but not more than 10 μm in thickness, and be not less than 4 mm but not more than 6 mm in diameter. When the thickness and the diameter are not included in the foregoing ranges, the bonding strength decreases.

The brazed bond layer 6 is filled into the interstice between the terminal 3 and the connecting member 5 with no gap while not reacting on the terminal 3 or the connecting member 5. Thus, the brazed bond layer 6 exists in intimate contact with both the terminal 3 and the connecting member 5. The brazed bond layer 6 is extremely thin, and thereby the bonding strength between the connecting member 5 and the terminal 3 is accordingly extremely high. The braze foil 20 melted when the brazed bond layer 6 is formed flows into the clearance 72 formed between the bottom surface 5b of the connecting member 5 and the bottom surface 4d of the hole 4a. For this reason, the thickness of the brazed bond layer 6 can be made thin.

The clearance 71 formed between the side surface 51a of the body portion 51 and the surface 4d of the hole 4a is wider than 0 mm, but not wider than approximately 0.5 mm. Furthermore, the brazed bond layer 6 fixes the bonding surface 52b in a way that the bonding surface 52b of the connecting member 5 enters inside the hole 4a. For this reason, even when a torque or a bending force is applied to the connecting member 5, the connection between the connecting member 5 and the ceramic member 4 does not break.

The materials for the heater resistors 2 are not specifically limited. However, a sheet-shaped metal bulk material should preferably be used. An example of the sheet-shaped metal bulk material is a metal formed into a single sheet. Other examples of the sheet-shaped metal bulk material include a bulk material made of a plate-shaped body having many pores (a perforated metal), and a bulk material made of a mesh-shaped body.

In the semiconductor wafer susceptor 1 including the bonding structure according to first embodiment, the brazed bond layer 6 does not contain nickel (Ni). Accordingly, intermetallic compound is not produced between the connecting member 5 and the terminal 3. As a result, the semiconductor wafer susceptor 1 can enhance the durability against external forces generated by heat cycles, handlings and the like. In addition, since the brazed bond layer 6 is made of gold (Au) only, the solid solution layer but not a vulnerable intermetallic compound is formed in the semiconductor wafer susceptor 1. Accordingly, this solid solution layer functions as a buffer layer when the external forces are applied to the semiconductor wafer susceptor 1.

Figure 15A:
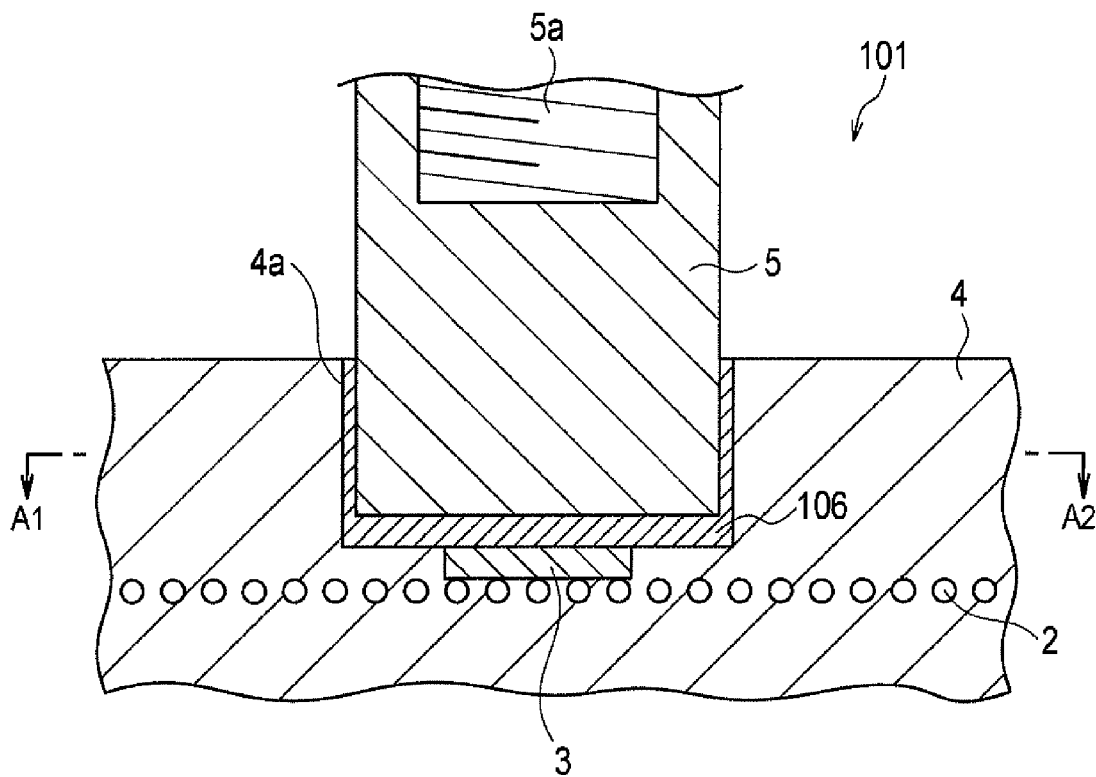
FIG. 15A is a schematic, cross-sectional view of a semiconductor wafer susceptor not including a clearance, which is vertical to the main surface of the ceramic member included in the semiconductor wafer susceptor.
Figure 15B:
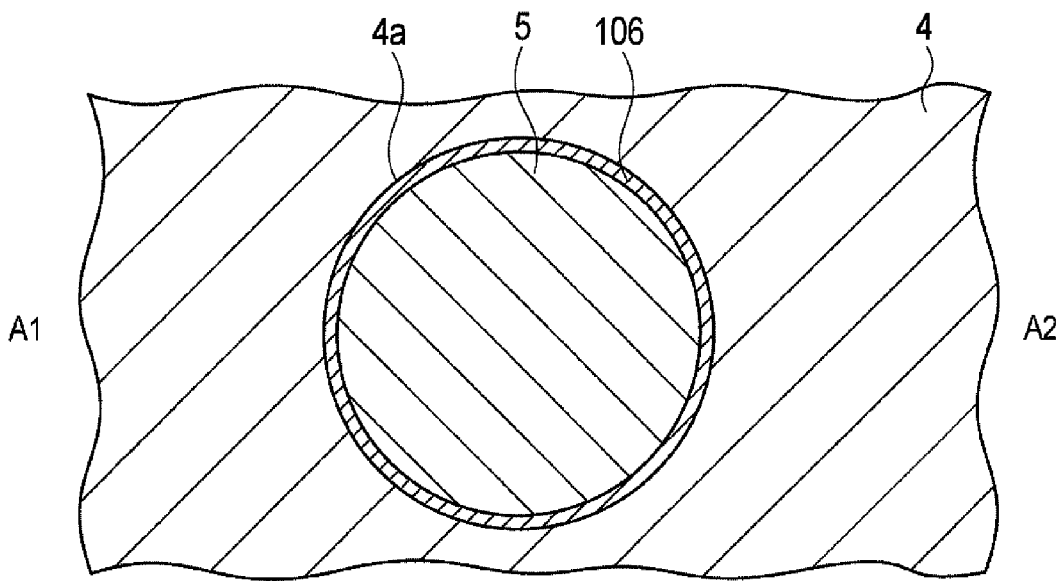
FIG. 15B is a schematic, cross-sectional view of the semiconductor wafer susceptor not including a clearance, which is parallel with the main surface of the ceramic member included in the semiconductor wafer susceptor.

Here, with reference to FIGS. 15A and 15B, considered is a case where a semiconductor wafer susceptor 101 includes a brazed bond layer 106 that fills the hole 4a in the ceramic member 4 except for a space occupied by the connecting member 5. In this semiconductor wafer susceptor 101, the connecting member 5 is fixedly attached to the ceramic member 4 while not including a clearance interposed in between. Accordingly, the heat cycles in the manufacturing or use of the semiconductor wafer susceptor 101 causes the stress between the connecting member 5 and the ceramic member 4, since the thermal expansion coefficients are different between the connecting member 5 and the ceramic member 4. As a result, the ceramic member 4 surrounding the connecting member 5 tends to break. On the other hand, according to the first embodiment, the semiconductor wafer susceptor 1 includes the clearance 71 and the clearance 72. The clearances 71 and 72 moderate the stress, thereby the ceramic member 4 does not break. Note that it is desirable that a semiconductor wafer susceptor should have a configuration according to the second embodiment to be described later, if the semiconductor wafer susceptor need to have a higher torsional breaking strength than the semiconductor wafer susceptor 1 according to the first embodiment.

Method of Manufacturing a Semiconductor Wafer Susceptor (Bonding Structure)

Figure 2:
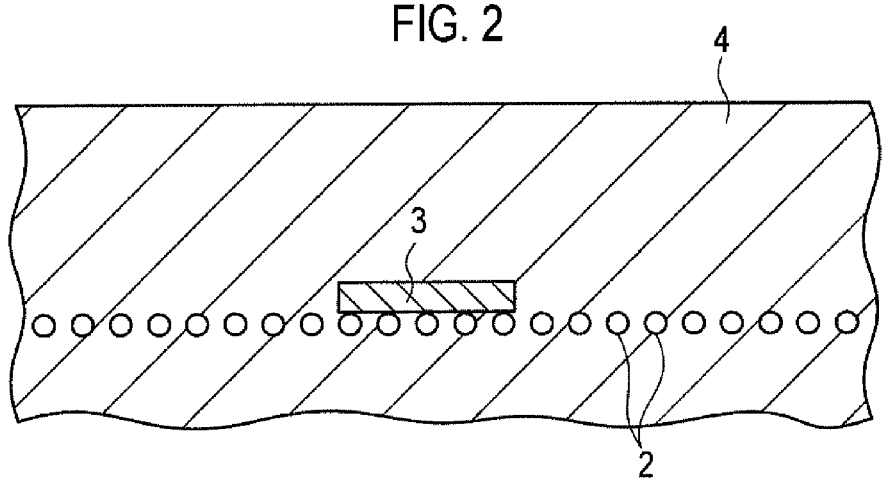
FIG. 2 shows a process of manufacturing the semiconductor wafer susceptor according to the fist embodiment.

(1) As shown in FIG. 2, the ceramic member 4 is prepared in which the heater resistors 2 are embedded in parallel with the main surface of the ceramic member 4, and in which the terminal 3 is embedded so that the terminal 3 electrically contacts the heater resistors 2.

Figure 3B:
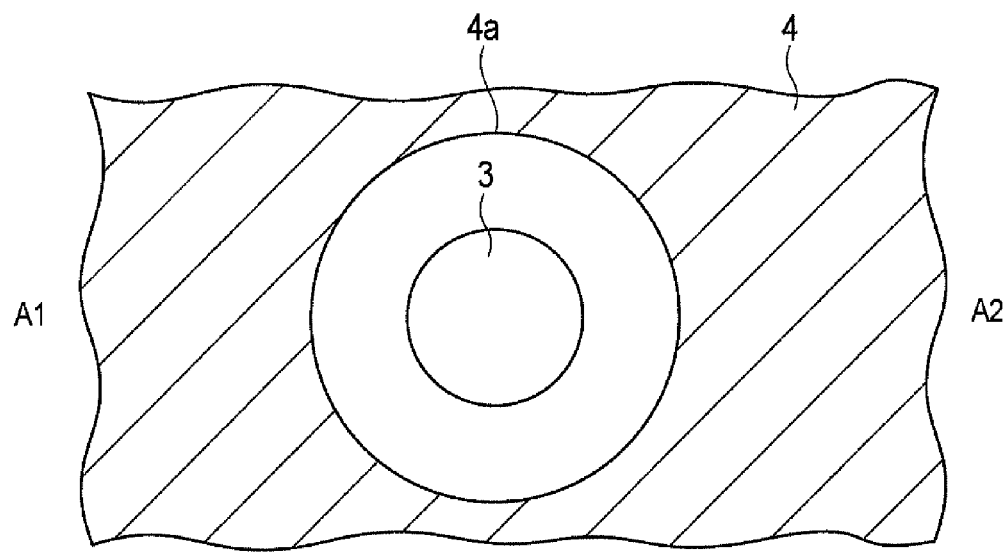

(2) As shown in FIGS. 3A and 3B, the hole 4a having a larger inner diameter than the outer diameter of the connecting member 5 is formed in the ceramic member 4 so that the clearance 71 can be formed between the outer diameter of the connecting member 5 and the surface of the hole 4a. The clearance 71 is formed so as to allow the connecting member 5 to thermally expand within the hole 4a when the connecting member 5 is inserted in the hole 4a. Further, the braze foil 20 is provided in the first space 4c indicated with an imaginary line in FIG. 3A. Note that the thickness of the braze foil 20 is 0.2 mm in the present embodiment.

(3) As shown in FIG. 4, the braze foil 20 is arranged on the bottom surface 4b to which the main surface (exposed surface) of the terminal 3 is exposed. Subsequently, the connecting member 5 is placed in the hole 4a of the ceramic member 4 with the braze foil 20 interposed in between. Thereafter, a weight weighing not more than 500 g is placed on the connecting member 5.

Then, the braze foil 20 is heated and thus melted. With regard to the heating temperature, it is desirable that the braze foil 20 should be heated to a temperature approximately 20° C. higher than the melting point of gold. The braze foil 20 is left heated at the temperature for approximately 5 minutes, after making sure that the braze foil 20 is melted. Thereafter, the heating process is terminated, and the braze foil 20 is left to be cooled down naturally.

When the braze foil 20 is melted, most part of the braze foil 20 flows out from the bonding surface 52b. A part of the braze foil 20 that remains on the bonding surface forms the brazed bond layer 6. The connecting member 5 is bonded to the terminal 3 via this brazed bond layer 6. Because the braze foil 20 flows out from the bonding surface when melted, the thickness of the brazed bond layer 6 formed after the braze foil 20 is melted is thinner than the thickness of the braze foil 20, i.e., thinner than 0.2 mm. In this manner, the semiconductor wafer susceptor 1 shown in FIG. 1A and 1B is manufactured.

The Second Embodiment

Semiconductor Wafer Susceptor (Bonding Structure)

Descriptions will be provided, focusing mainly on the difference between the semiconductor wafer susceptor 11 according to the second embodiment and the semiconductor wafer susceptor 1 according to the first embodiment.

Figure 5A:
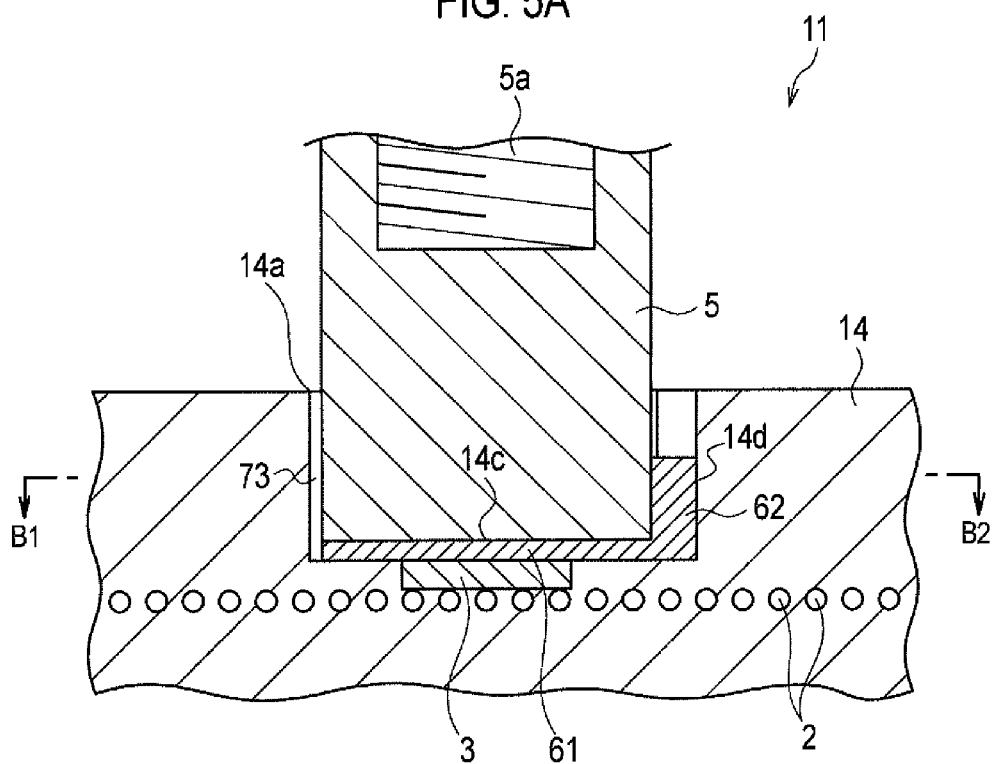
FIG. 5A is a schematic, cross-sectional view of a semiconductor wafer susceptor according to the second embodiment, which is vertical to the main surface of the ceramic member included in the semiconductor wafer susceptor.
Figure 5B:
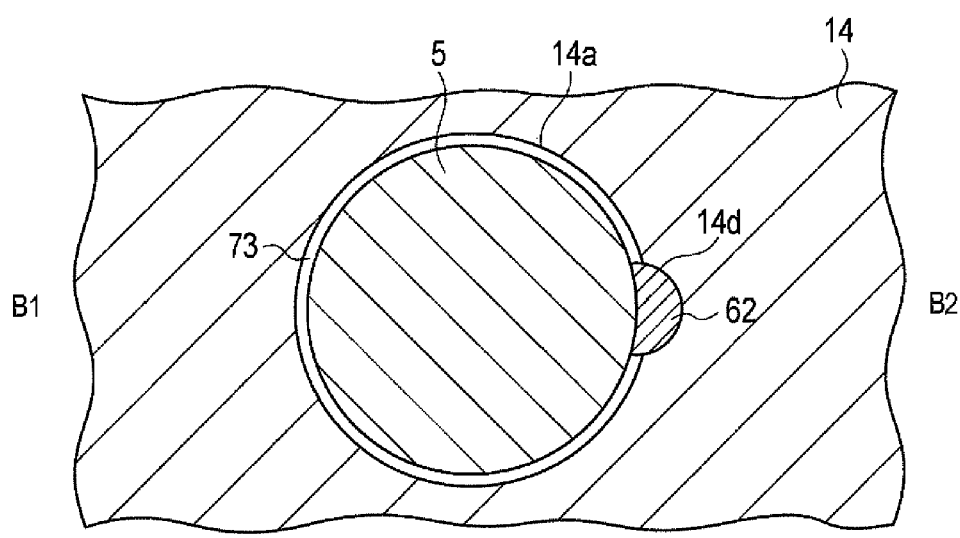
FIG. 5B is a schematic, cross-sectional view of the semiconductor wafer susceptor according to the second embodiment, which is parallel with the main surface of the ceramic member included in the semiconductor wafer susceptor.

The semiconductor wafer susceptor 11 according to the second embodiment shown in FIG. 5A has a configuration in which a braze pool space 14d is formed in a part of the sidewall of the hole 14a in the ceramic member 14. The braze pool space 14d has a substantially semicircular shape in a B1-B2 plane, which is obtained through cutting the ceramic member 14 along the B1-B2 line, as shown in FIG. 5B. The braze pool space 14d is partially filled with a braze material 62. Here, the braze material 62 is a material in which a braze foil 61 to be described later is melted, and constitutes a part of the brazed bond layer.

The semiconductor wafer susceptor 11 according to the second embodiment has the braze pool space 14d in a part of the clearance 73, in addition to the clearance 73. Thus, the braze material 62 filled in such a space plays a role as a lock (hereinafter referred to as a "locking effect"). For this reason, when compared with any other semiconductor wafer susceptor not including braze pool space 14d, the semiconductor wafer susceptor according to the embodiment has a far higher torsional breaking strength.

In the second embodiment, only the part of the clearance 73 is filled with the braze material 62. Accordingly, the connecting member 5 and the ceramic member 14 are fixedly attached to each other only in the part of the surface of the hole 14a, while the clearance 73 is formed in most part of the space between the connecting member 5 and the ceramic member 14. Consequently, the ceramic member 14 according to the second embodiment does not break unlike the ceramic member 101 as shown in FIGS. 15A and 15B, in which all of the space formed between the connecting member 5 and the braze pool space 14d are filled with the braze material.

In other words, the semiconductor wafer susceptor 11 according to the second embodiment has a far higher torsional breaking strength than the semiconductor wafer susceptor 1 according to the first embodiment in which the connecting member 5 having the same cross-sectional shape as the hole 4a is inserted in the hole 4a. In the first embodiment, the clearances 71 and 72 are produced between the surface of the hole 4a and the connecting member 5, when the connecting member 5 having the same cross-sectional form as the hole 4a is inserted in the hole 4a. As described in the first embodiment, when the connecting member 5 is inserted in the hole 4a, the clearances 71 and 72 are produced between the hole 4a and the connecting member 5. Some of the connecting members 5 are formed while contacting with a part of the surface of the hole 4a. However, the clearances 71 and 72 always exist somewhere between the surface of the hole 4a and the connecting member 5 depending on which direction the connecting member 5 may be twisted. Accordingly, when the connecting member 5 is twisted in a reverse direction, the ceramic member 4 tends to break. On the contrary, in the second embodiment, the braze material 62 is filled in the braze pool space 14 having a substantially semicircular shape, so that the clearance 73 is not formed in the braze pool space 14d even when a screw attached to the groove 5a formed in the connecting member 5 is tightened or loosened in both directions of twisting. Thus, the braze material 62 exerts the higher torsional breaking strength as its locking effect.

The braze pool space 14d may be formed singularly in a location of the surface of the hole 4a, or multiple braze pool spaces 14d may be formed respectively in multiple locations thereof. This is because, when paired two or four braze pool spaces 14d are located symmetrically to each other, for example, the torsional breaking strength of the multiple braze pool spaces 14d becomes higher. However, it is undesirable to provide five or more braze pool spaces 14d in the respective locations of the surface of the hole 4a. This is because the larger number of braze pool spaces 14d require larger amount of braze material, and increase probability of breakage in the ceramics. Above all, it is desirable that one or two pairs of braze pool spaces 14d should be formed in the respective mutually-opposed locations in the surface of the hole 14a. It is most desirable that one pair of braze pool spaces 14d should be formed in the respective mutually-opposed locations on the surface of the hole 14a.

Method of Manufacturing a Semiconductor Wafer Susceptor

Descriptions will be provided for a method of manufacturing a semiconductor wafer susceptor 11 according to the second embodiment, focusing mainly on the differences from the method of manufacturing a semiconductor wafer susceptor 1 according to the first embodiment.

Figure 6:
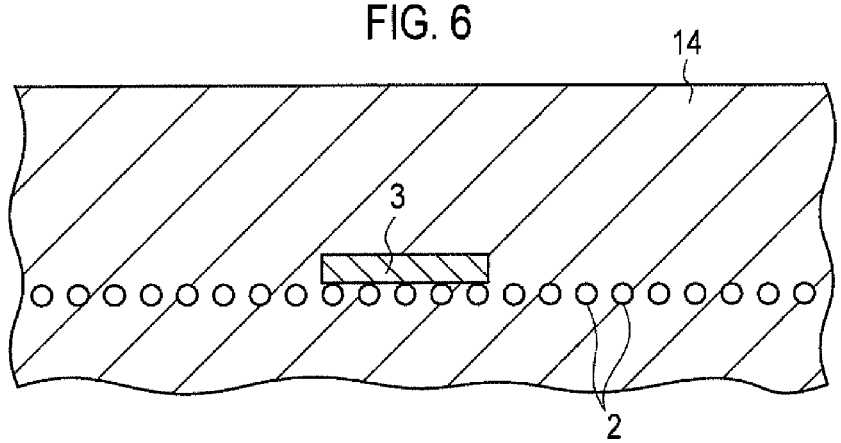
FIG. 6 shows a process of manufacturing the semiconductor wafer susceptor according to the second embodiment.
Figure 7A:
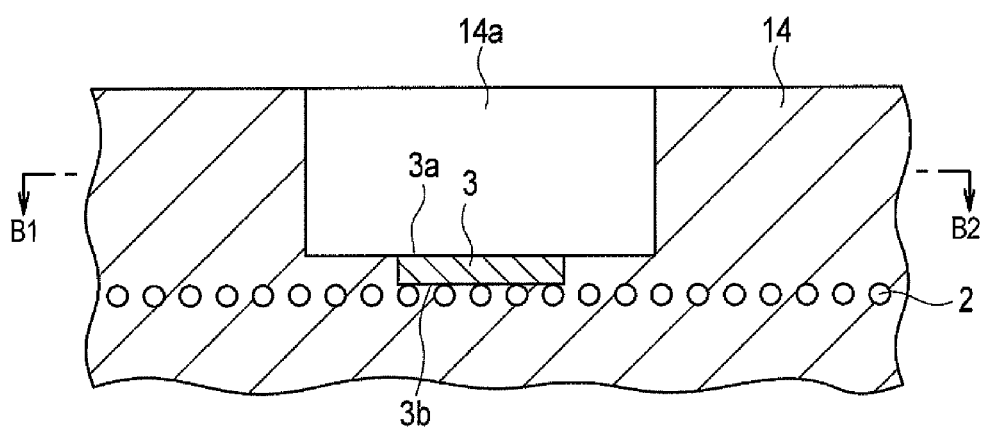
FIGS. 7A and 7B shows a process of manufacturing the semiconductor wafer susceptor according to the second embodiment.
Figure 7B:
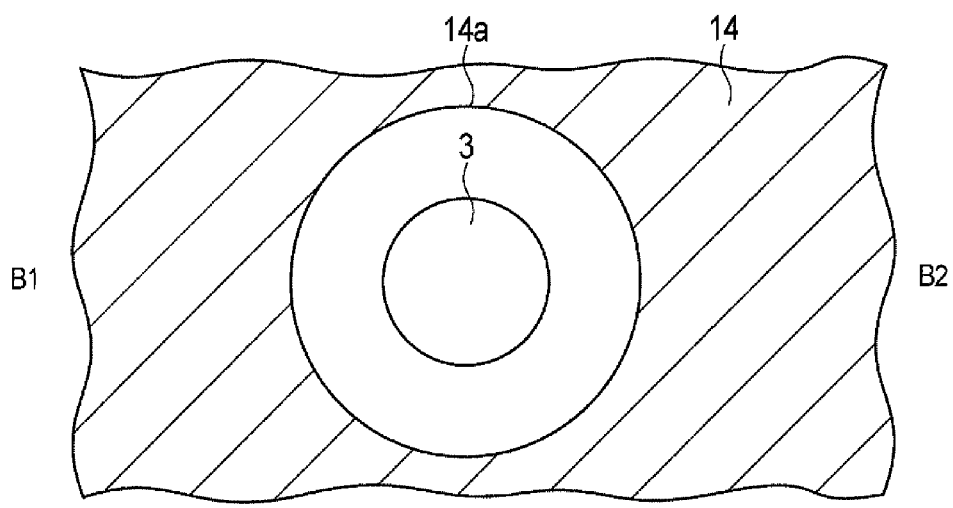

(1) As shown in FIGS. 6, 7A and 7B, the ceramic member 14 is processed through steps similar to those shown in FIGS. 2, 3A and 3B.

Figure 8A:
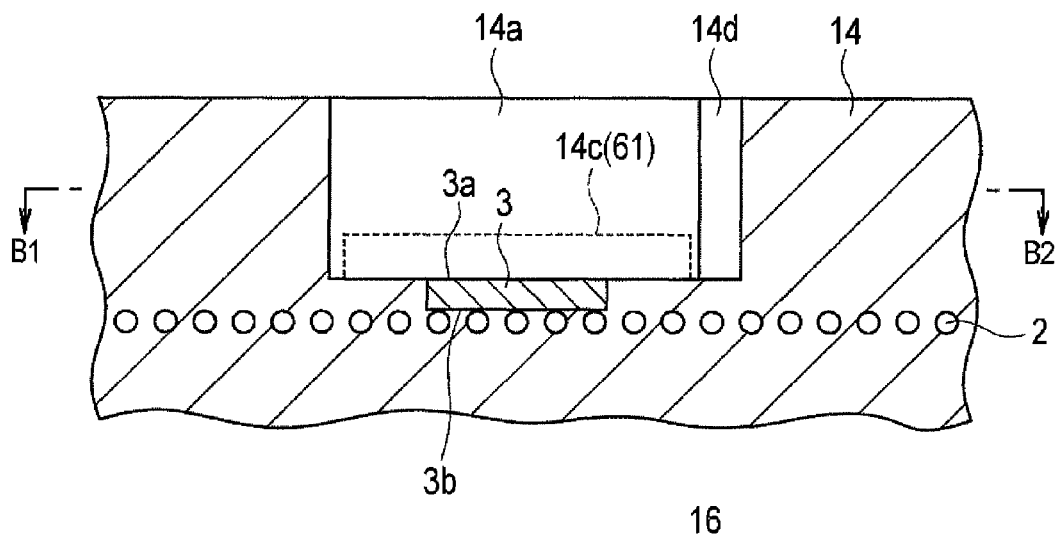
FIGS. 8A and 8B shows a process of manufacturing the semiconductor wafer susceptor according to the second embodiment.
Figure 8B:
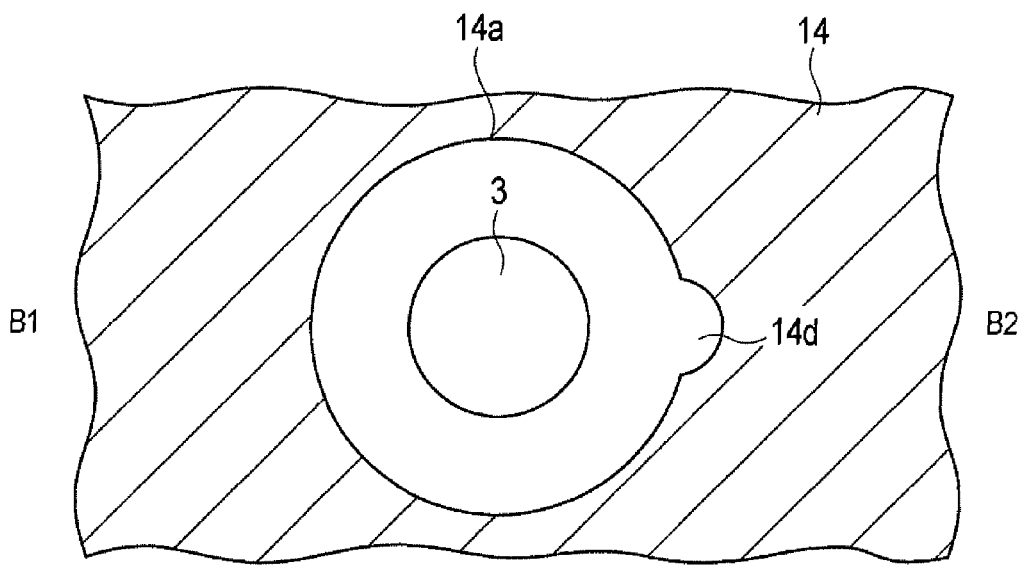

(2) As shown in FIGS. 8A and 8B, the braze pool space 14d is formed in a part of the outer diameter of the hole 14a in the ceramic member 14 by use of a drill or the like. In this respect, the braze pool space 14d may be formed at the same time as the hole 14a is formed.

Figure 9A:
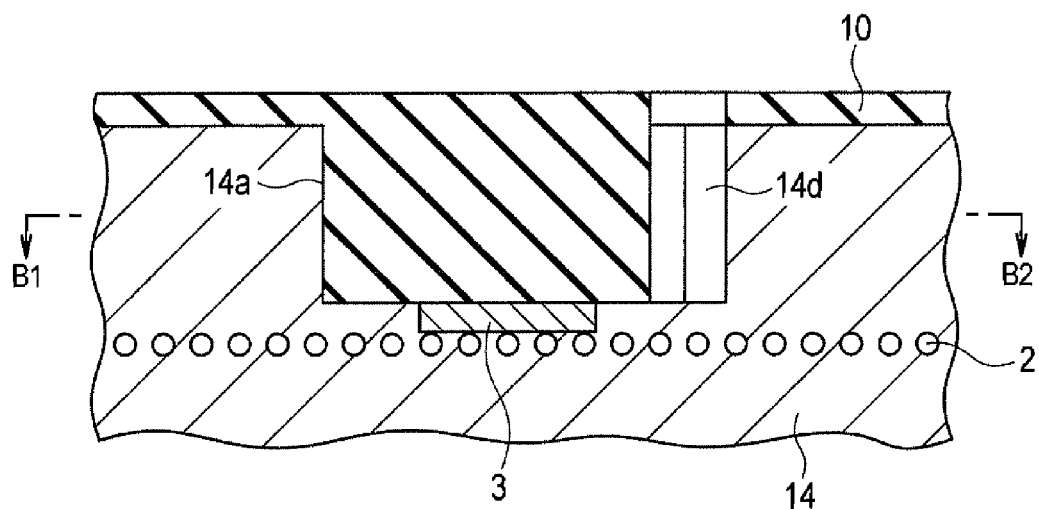
FIGS. 9A and 9B shows a process of manufacturing the semiconductor wafer susceptor according to the second embodiment.
Figure 9B:
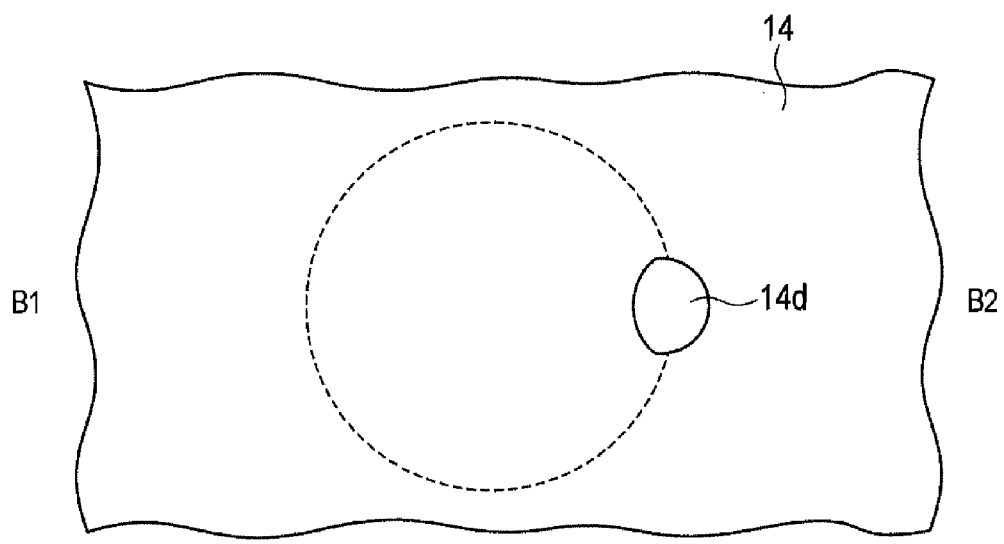

(3) Subsequently, as shown in FIGS. 9A and 9B, a sealing member 10 is arranged on the ceramic member 14. Thereafter, a metallizing treatment is applied to the ceramic member 14. It is preferable that the metallizing treatment is performed on the connecting member, on a part of the surface to be filled with the braze material. The metallizing treatment makes it easier for the melted braze foil 61 to fill in the braze pool space 14d, when the braze foil 61 is melted. However, the metallizing treatment is not necessarily required. The surface of the connecting member 5 is preferably subjected to an oxidation treatment, except for a part of the surface to be filled with the braze material. The surface oxidation treatment prevents the braze material from being applied on the surface of the connecting member 5, so that the braze material does not fill the entire clearance (entire braze pool space 14d). Instead of the oxidation treatment, a material with a poor wettability may be applied to the surface of the connecting member 5. With at least one of the metallizing treatment on the ceramic member 14 and the oxidation treatment on the surface of the connecting member 5, the braze material can be filled only in the braze pool space 14d.

Figure 10:
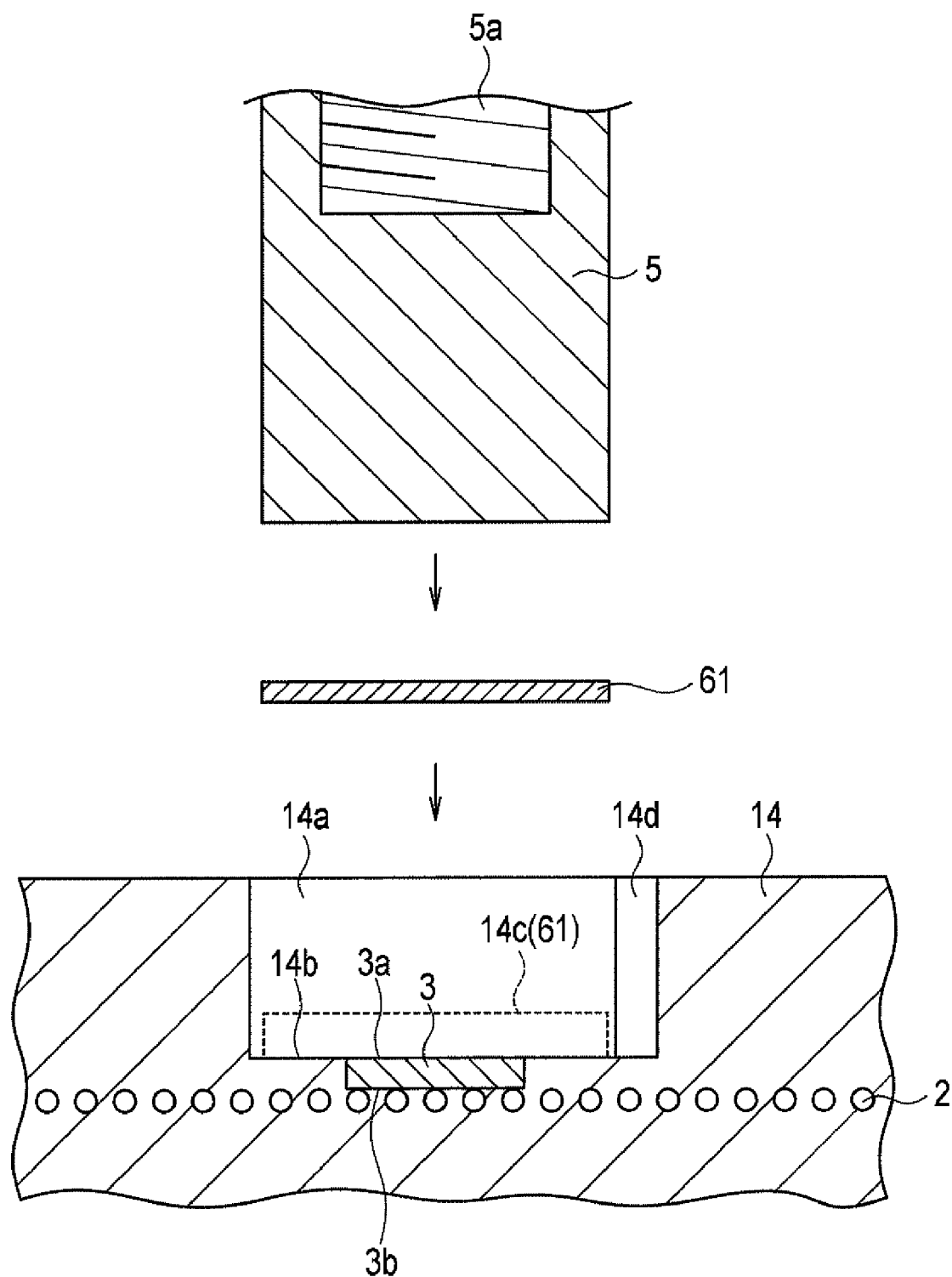
FIG. 10 shows a process of manufacturing the semiconductor wafer susceptor according to the second embodiment.

(4) As shown in FIG. 10, the braze foil 61 is arranged on the bottom surface 14b to which the first main surface (exposed surface) of the terminal 3 is exposed. The braze foil 61 is formed on the first space 14c. Subsequently, the connecting member 5 is arranged in the hole 4a in the ceramic member 4 with the brazed bond layer 6 interposed in between. Thereafter, the braze foil 61 is heated and thus melted. With regard to the heating temperature, it is desirable that the braze foil 61 should be heated up to a temperature approximately 20° C. higher than the melting point of gold, The braze foil 61 is left heated at the temperature for approximately 5 minutes after making sure that the braze foil 61 is melted.

(5) Then, the braze material creeps up on the side surface of the connecting member 5 and on the side surface of the braze pool space 14d. Thereby, the surface of the braze material gradually rises, and the braze pool space 14d is filled with braze material. Subsequently, the heating process is terminated, and the brazed bond layer 6 is left to be cooled down naturally, Thereby, the connecting member 5 is bonded to the terminal 3 via the brazed bond layer 6.

Through these steps, the semiconductor wafer susceptor 11 shown in FIGS. 5A and 5B is produced.

According to the second embodiment, intermetallic compound is not produced between the connecting member 5 and the terminal 3 embedded in the ceramic member 4. Furthermore, the second embodiment can provide a bonding structure that is reliable even when an external screw is fitted into and removed from the connecting member 5, and that can be reliably used even at a high temperature, and a semiconductor device manufacturing apparatus having this structure.

MODIFIED EXAMPLES

Semiconductor Wafer Susceptor (Bonding Structure)

For the purpose of causing the semiconductor wafer susceptor to have an increased torsional breaking strength, the semiconductor wafer susceptor may have any one of the following structures.

Figure 11A:
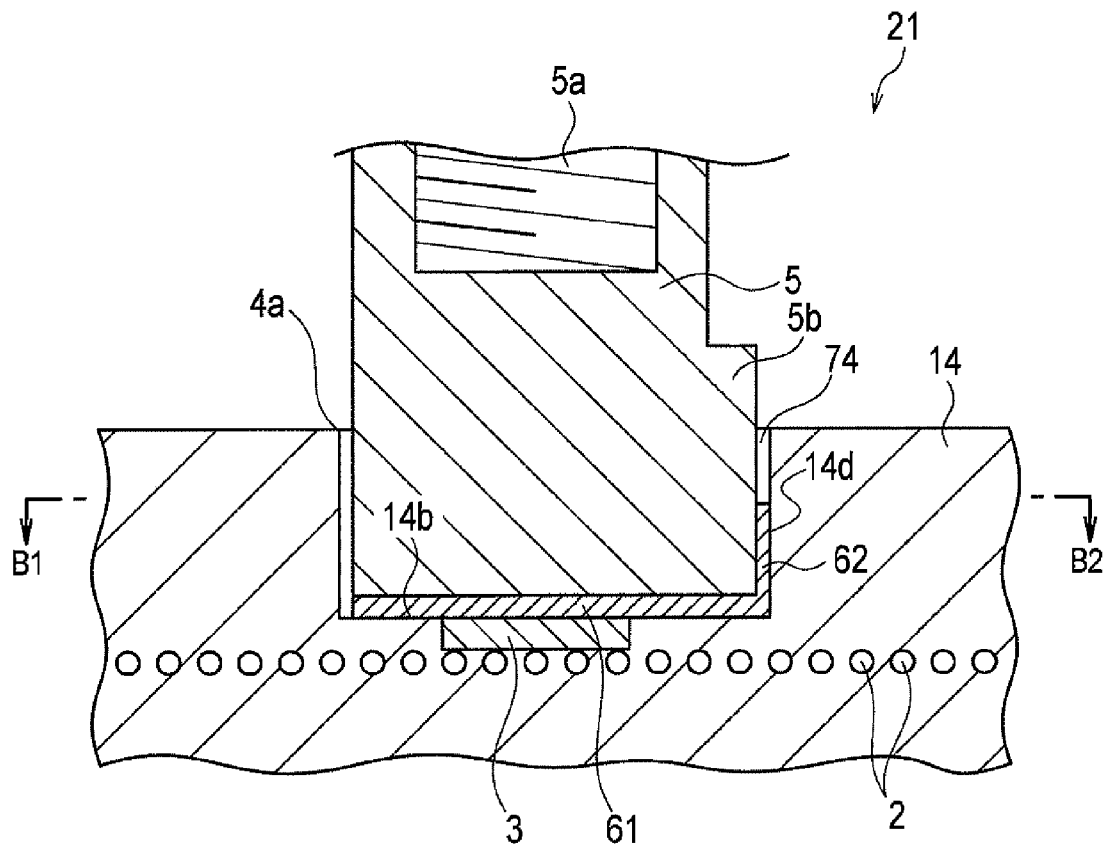
FIG. 11A is a schematic, cross-sectional view of a semiconductor wafer susceptor according to the first modified example, which is vertical to the main surface of the ceramic member included in the semiconductor wafer susceptor.
Figure 11B:
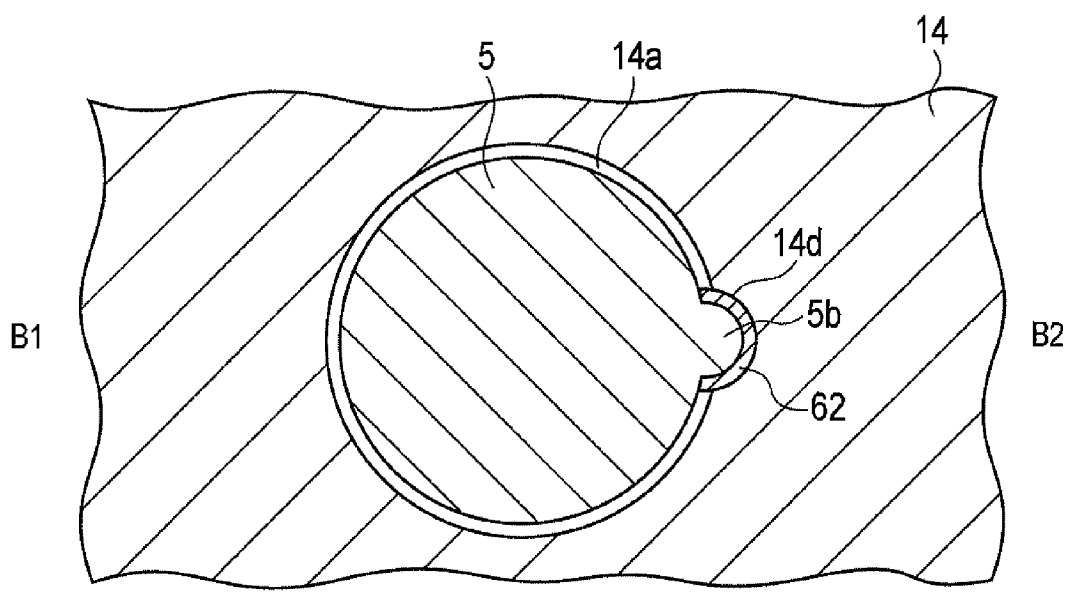
FIG. 11B is a schematic, cross-sectional view of the semiconductor wafer susceptor according to the first modified example, which is parallel with the main surface of the ceramic member included in the semiconductor wafer susceptor.

First modified example: FIG. 11A is a schematic, cross-sectional view of a semiconductor wafer susceptor 21 according to the first modified example, which is vertical to the main surface of the ceramic member 14. A protruded portion 5b having a substantially semicircular shape in the cross-sectional plane of the connecting member 5 may be formed in a part of a circumferential surface of the connecting member 5. FIG. 11B is a schematic, cross-sectional view of the semiconductor wafer susceptor according to the first modified example, the cross-sectional view showing the B1-B2 plane shown in FIG. 11A when viewed from the opening side. As shown in FIG. 11B, the protruded portion 5b fills a part of the braze pool space 14d. A part of the braze pool space 14d may be filled with the braze material 62. The protruded portion 5b fits with the braze pool space 14d and forms a locking portion. Accordingly, the torsional breaking strength can be enhanced.

According to the first modified example, the braze material 62 that fills a part of the clearance 74 formed between the protruded portion 5b and the braze pond space 14d plays a function as a lock, the torsional braking strength is high.

SECOND MODIFIED EXAMPLE

Figure 12A:
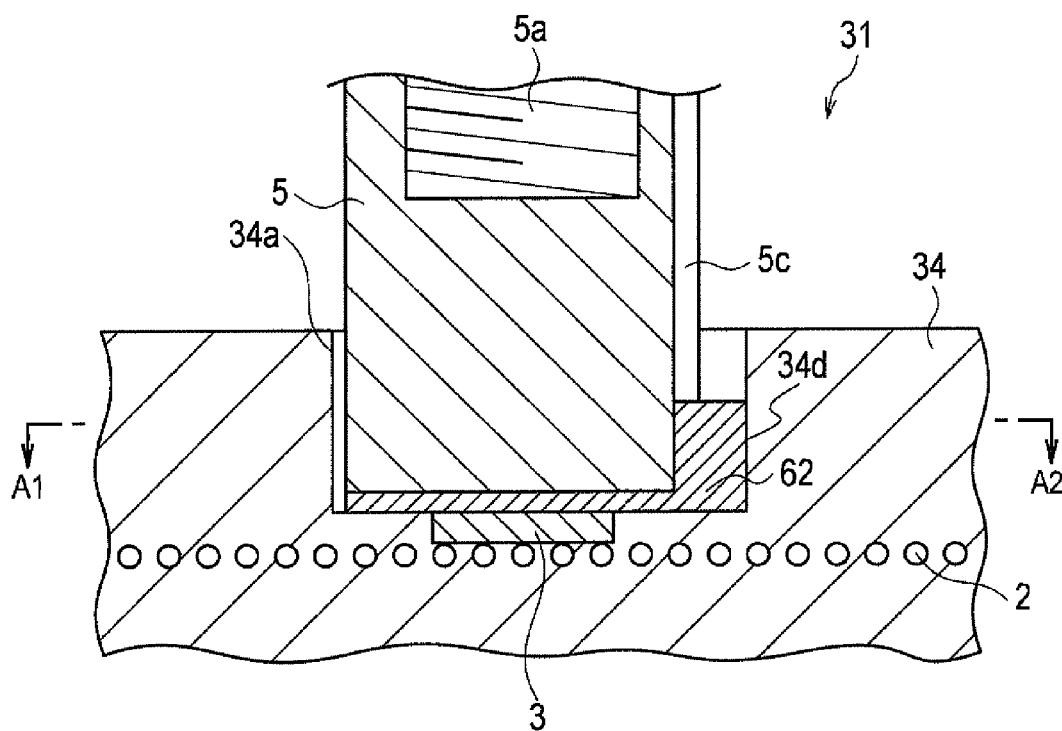
FIG. 12A is a schematic, cross-sectional view of a semiconductor wafer susceptor according to the second modified example, which is vertical to the main surface of the ceramic member included in the semiconductor wafer susceptor.
Figure 12B:
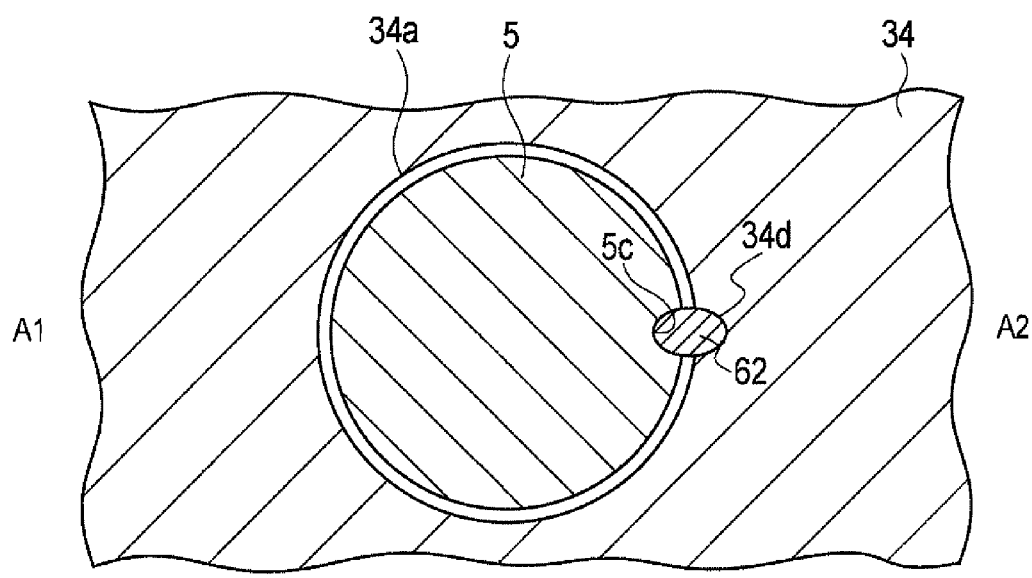
FIG. 12B is a schematic, cross-sectional view of the semiconductor wafer susceptor according to second modified example, which is parallel with the main surface of the ceramic member included in the semiconductor wafer susceptor.

FIG. 12A is a schematic, cross-sectional view of a semiconductor wafer susceptor 31 according to the second modified example, which is vertical to the main surface of the ceramic member 34. The connecting member 5 has a recessed portion 5c recessing inwardly from a part of the circumferential surface of the connecting member 5. Further, the braze pool space 34d is formed on a part of the surface of the hole 34a, which is formed on the main surface of the ceramic member. The braze pool space 34d has a substantially semicircular shape in the A1-A2 cross section shown in FIG. 12A and FIG. 12B. The braze material 62 fills a part of the recessed portion 5c and a part of the braze pool space 14d.

THIRD MODIFIED EXAMPLE

Figure 13A:
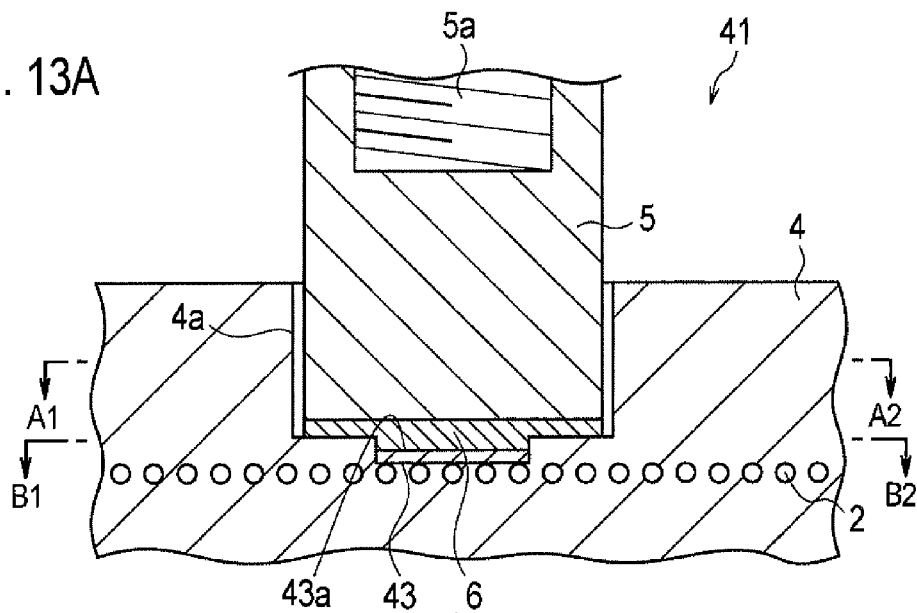
FIG. 13A is a schematic, cross-sectional view of a semiconductor wafer susceptor according to the third modified example, which is vertical to the main surface of the ceramic member included in the semiconductor wafer susceptor.
Figure 13B:
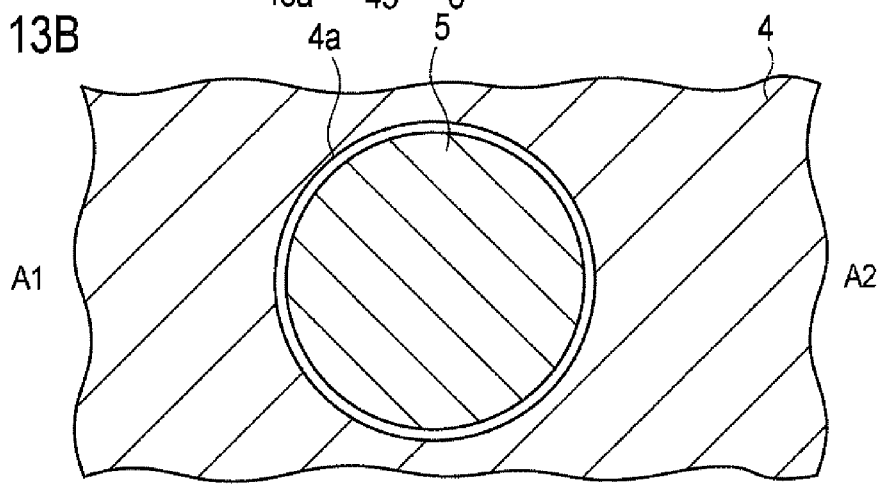
FIG. 13B is a schematic, A1-A2 cross-sectional view of the semiconductor wafer susceptor according the third modified example, which is parallel with the main surface of the ceramic member included in the semiconductor wafer susceptor according to modification 3.
Figure 13C:
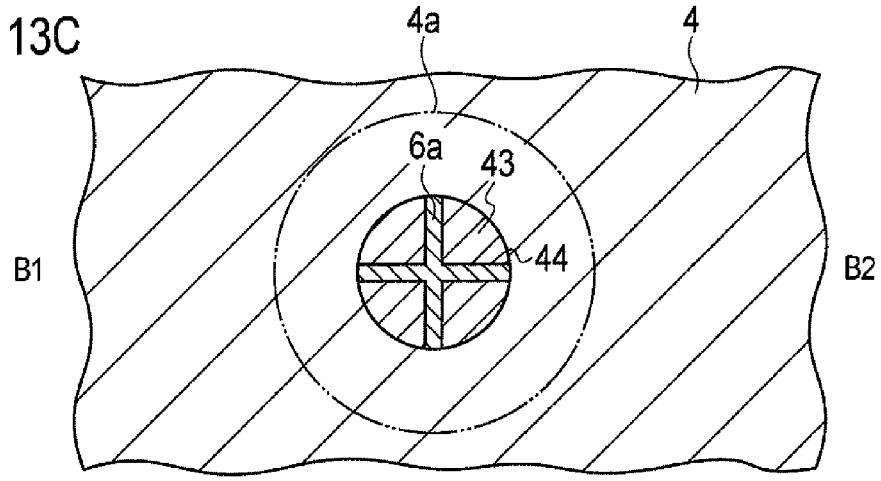
FIG. 13C is a schematic, B1-B2 cross-sectional view of the semiconductor wafer susceptor according to the third modified example, which is parallel with the main surface of the ceramic member included in the semiconductor wafer susceptor according to the third modified example.

FIG. 13A is a schematic, cross-sectional view of a semiconductor wafer susceptor 41 according to the third modified example, which is vertical to the main surface of the ceramic member 4. Although the diameter of the connecting member 5 is fixed, a groove 44 may be formed on the first main surface 43a of a terminal 43 so as to be formed into a cross. The brazed bond layer 6 is formed while the melted braze material fills the groove 44 and serves as an anchor. As a result, an anchor effect can be achieved, and thereby the torsional breaking strength is enhanced.

EXAMPLES

Measurement of Bonding Strength

Examples 1 to 9 and Comparative Examples 1 to 21

Figure 14:
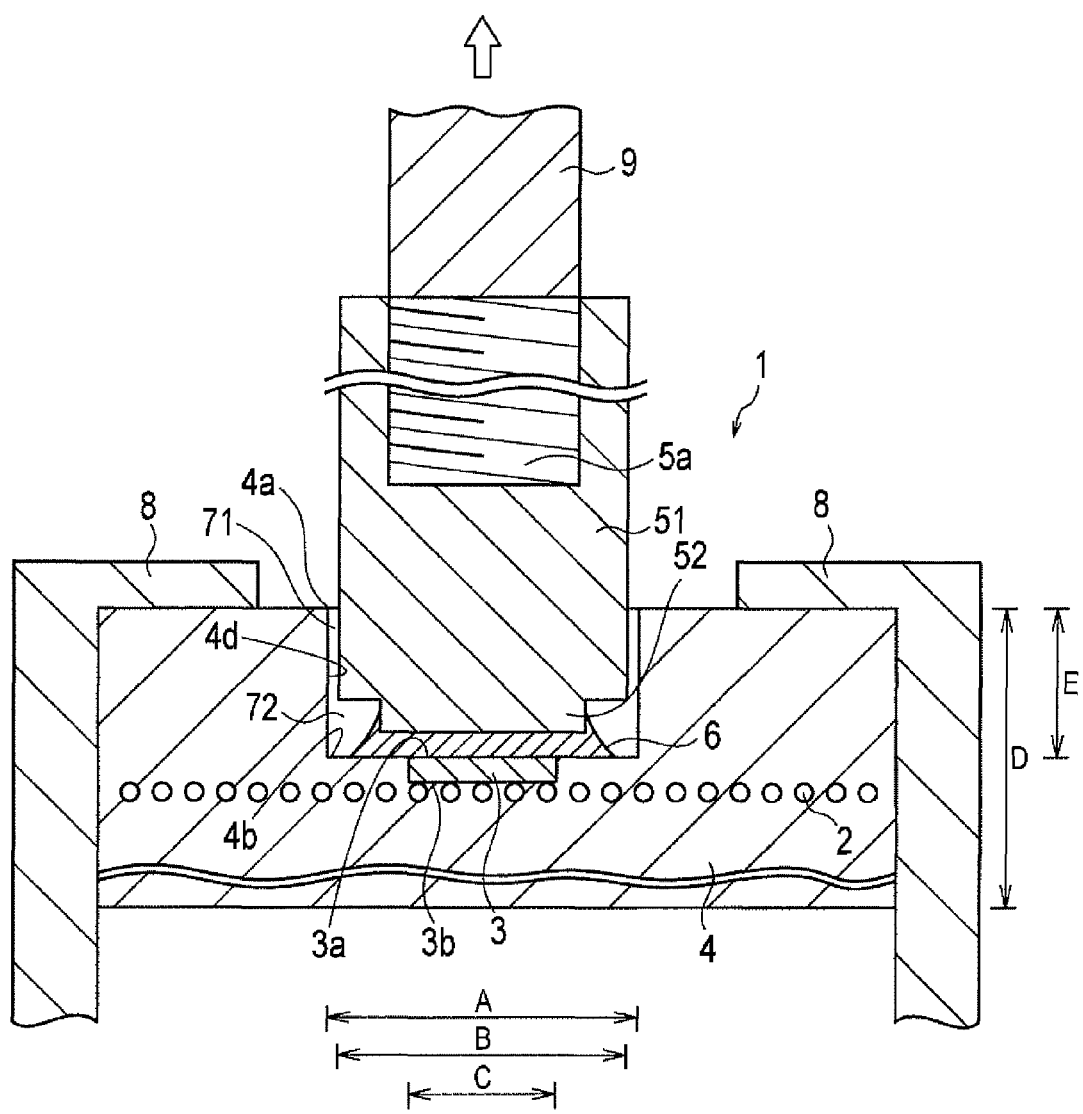
FIG. 14 is a drawing showing a concept with which the bonding strength of a bonding structure of a semiconductor wafer susceptor is measured.

Multiple test-piece ceramic members 4 each made of aluminum nitride were prepared. As shown in FIG. 14, each test-piece ceramic member 4 included: a hole 4a with a diameter A of any one of 4.1 mm, 5.1 mm and 6.1 mm, as well as with a depth E of 4 mm; and a terminal 3 with a diameter C of 3 mm, and with a thickness of 0.5 mm. The thickness D of each test-piece ceramic member 4 was 5 mm. In addition, multiple test-piece connecting members 5 each made of molybdenum were prepared. As shown in FIG. 14, the outer diameter B of each test-piece connecting member 5 was any one of 4 mm, 5 mm and 6 mm. In addition, a groove 5a was formed in each test-piece connecting member 5.

The braze foil 20 with a thickness of 0.2 mm was placed in the hole 4a of the ceramic member 4, and the connecting member 5 was placed on the braze foil 20. The outer diameter B of the connecting member 5 was set equal to the outer diameter of the braze foil 20. A weight made of molybdenum (not illustrated) having weights as shown in Table 1 was placed on the connecting member 5. Thereby, the bottom surface 5b of the connecting member 5 pressed the bottom surface 4d of the hole 4a with the braze foil 20 interposed in between. The thickness of the brazed bond layer 6 formed when the braze foil 20 was melted was arranged to be controlled by changing the weight of the molybdenum weight. Thereafter, the braze foil 20 (gold) was heated up to a temperature which was approximately 20° C. higher than the melting point of the braze foil 20 (gold). After making sure that the braze foil 20 was melted, the connecting member 5 was left for five minutes, and then cooled down naturally.

Through the above-described steps, the connecting member 5 and the ceramic member 4 were bonded together with the brazed bond layer 6. Thereby, as shown in FIGS. 1A and 1B, the bonding structure including brazed bond layer 6 on the surface of the terminal 3 was obtained.

Thereafter, the resultant test-piece ceramic member 4 was held by a fixture 8 shown in FIG. 14. Subsequently, a load was applied to the test-piece ceramic member 4 in the vertical direction upwardly as indicated by an arrow in FIG. 14, by use of a pulling member 9 screwed in the groove 5a formed in the test-piece connecting member 5. Then, measurements were performed with respect to a bonding strength (unit: kgf) of the bonding structure against the load which the bonding structure withstood when the test-piece connecting member 5 was separated from the ceramic member 4 was measured. The experiment conditions and results are shown in Table 1.

TABLE 1

| NO. | DIAMETER OF TERMINAL (mm) | THICKNESS OF Au (μm) | Au—17% Ni ALLOY (μm) | BONDING STRENGTH (kgf) | LOAD APPLIED WHEN BONDED (g) |
|---|---|---|---|---|---|
| COMPARATIVE EXAMPLE 1 | 4 | 1 | 0 | 40 | 1000 |
| EXAMPLE 1 | 4 | 3 | 0 | 232 | 500 |
| EXAMPLE 2 | 4 | 5 | 0 | 248 | 200 |
| EXAMPLE 3 | 4 | 10 | 0 | 240 | 100 |
| COMPARATIVE EXAMPLE 2 | 4 | 30 | 0 | 86 | 0 |
| COMPARATIVE EXAMPLE 3 | 4 | 0 | 50 | 31 | 1000 |
| COMPARATIVE EXAMPLE 4 | 4 | 0 | 80 | 73 | 500 |
| COMPARATIVE EXAMPLE 5 | 4 | 0 | 100 | 88 | 200 |
| COMPARATIVE EXAMPLE 6 | 4 | 0 | 120 | 86 | 100 |
| COMPARATIVE EXAMPLE 7 | 4 | 0 | 160 | 50 | 0 |
| COMPARATIVE EXAMPLE 8 | 5 | 1 | 0 | 67 | 1000 |
| EXAMPLE 4 | 5 | 3 | 0 | 246 | 500 |
| EXAMPLE 5 | 5 | 5 | 0 | 251 | 200 |
| EXAMPLE 6 | 5 | 10 | 0 | 248 | 100 |
| COMPARATIVE EXAMPLE 9 | 5 | 30 | 0 | 90 | 0 |
| COMPARATIVE EXAMPLE 10 | 5 | 0 | 60 | 38 | 1000 |
| COMPARATIVE EXAMPLE 11 | 5 | 0 | 90 | 76 | 500 |
| COMPARATIVE EXAMPLE 12 | 5 | 0 | 100 | 92 | 200 |
| COMPARATIVE EXAMPLE 13 | 5 | 0 | 130 | 90 | 100 |
| COMPARATIVE EXAMPLE 14 | 5 | 0 | 170 | 20 | 0 |
| COMPARATIVE EXAMPLE 15 | 6 | 1 | 0 | 77 | 1000 |
| EXAMPLE 7 | 6 | 3 | 0 | 255 | 500 |
| EXAMPLE 8 | 6 | 5 | 0 | 269 | 200 |
| EXAMPLE 9 | 6 | 10 | 0 | 253 | 100 |
| COMPARATIVE EXAMPLE 16 | 6 | 30 | 0 | 96 | 0 |
| COMPARATIVE EXAMPLE 17 | 6 | 0 | 60 | 45 | 1000 |
| COMPARATIVE EXAMPLE 18 | 6 | 0 | 90 | 80 | 500 |
| COMPARATIVE EXAMPLE 19 | 6 | 0 | 110 | 98 | 200 |
| COMPARATIVE EXAMPLE 20 | 6 | 0 | 140 | 95 | 100 |
| COMPARATIVE EXAMPLE 21 | 6 | 0 | 180 | 70 | 0 |

Examples 1 to 3 and Comparative Examples 1 to 2

Examples 1 to 3 and comparative examples 1 to 2 were checked as to how the thickness of the brazed bond layer 6 affected the bonding strength, when the diameter of the terminal 3 was 4 mm and the diameter of the brazed bond layer 6 was also 4 mm. As a result, it was found that a suitable bonding strength is obtained where the thickness of the solder layer 6 is more than 3 μm but not more than 10 μm.

Comparative Examples 3 to 7

Examples 3 to 7 were checked with the same experimental method as examples 1 to 3 and comparative examples 1 to 2 were checked, except that the braze foil of Au-17% Ni containing 17% nickel with a thickness of 0.2 mm was provided. As a result, it was found that the brazed bond layer 6 reacts with molybdenum so that the thickness of the brazed bond layer 6 becomes thicker and therefore the bonding strength decreases.

Examples 4 to 6 and Comparative Examples 8 to 9

Examples 4 to 6 and comparative examples 8 to 9 were checked as to how the thickness of the brazed bond layer 6 affected the bonding strength, when the diameter of the terminal 3 was 5 mm and the diameter of the brazed bond layer was also 5 mm. As a result, it was found that a suitable bonding strength is obtained where the thickness of the brazed bond layer 6 is more than 3 μm but not more than 10 μm Comparative Examples 10 to 14

Comparative examples 10 to 14 were checked with the same experimental method as examples 4 to 6 and comparative examples 8 to 9 were checked, except that the braze foil of an Au-17% Ni containing 17% nickel with a thickness of 0.2 mm was provided. As a result, it was found that the bonding strength decreases.

Examples 7 to 9 and Comparative Examples 15 to 16

Examples 7 to 9 and comparative examples 15 to 16 were checked as to how the thickness of the brazed bond layer 6 affected the bonding strength, when the diameter of the terminal 3 was 6 mm and the diameter of the brazed bond layer was also 6 mm. As a result, it was found that a suitable bonding strength is obtained where the thickness of the brazed bond layer 6 is more than 3 µm but not more than 10 µm Comparative Examples 17 to 21

Comparative examples 17 to 21 were checked with the same experimental method as examples 7 to 9 and comparative examples 15 to 16 were checked, except that the braze foil made of Au-17% Ni containing 17% nickel with a thickness of 0.2 mm was provided. As a result, it was found that the bonding strength decreases.

Torsional Breakage Test

Examples 10 to 14 and Comparative Example 22

In accordance with the descriptions provided for the embodiment, semiconductor wafer susceptors respectively shown in FIGS. 1A, 1B, 5A, 5B and 11 to 15 were produced with conditions shown in Table 2. Subsequently, for each semiconductor wafer susceptor, a torque applied to the connecting member 5 was increased by 0.1 N·m each time the connecting member 5 was twisted with a torque wrench. Thereby, a torque which each semiconductor wafer susceptor withstood immediately before breakage of the semiconductor wafer susceptor was measured. Thereafter, each semiconductor wafer susceptor was alternately heated at 200° C. and at 700° C. for 100 cycles. After that, similarly, a torque which each semiconductor wafer susceptor withstood immediately before breakage of the semiconductor wafer susceptor was measured. Results obtained from this test are shown in the Table 2 below.

clearance produces the locking effect and the anchor effect, which contributes to the enhancement of the torsional breaking torque. Moreover, from examples 12 and 13, it is learned that the torsional breaking torque is further enhanced when the locking portion and the recessed portion were formed in addition to the braze pool space.

Measurement of Reaction Layer

The molybdenum-made connecting member 5 used in example 1 and the ceramic member 4 including the molybdenum-made terminal 3 placed in the bottom surface 4d were bonded together with the brazed bond layer 6 in between.

Figure 16A:
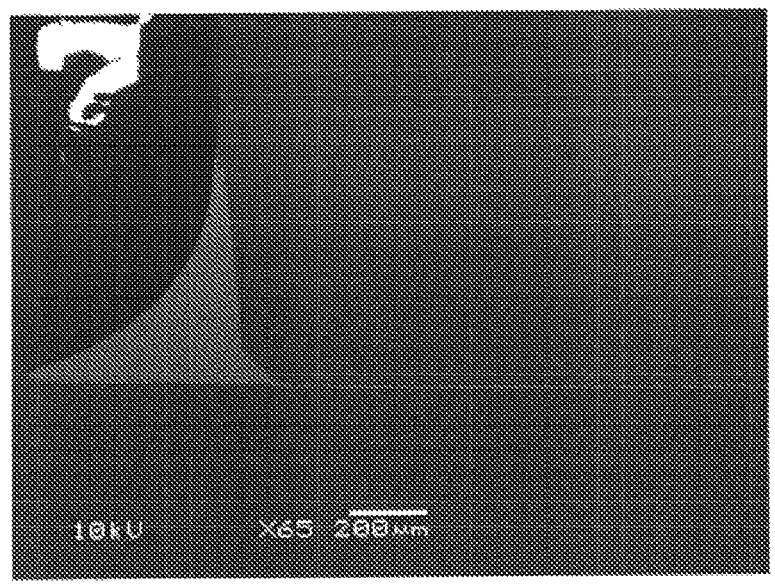
FIG. 16A and FIG. 16B are photographs of the cross-sectional plane in the vicinity of the bonding boundary between the connecting member 5 and the brazed bond layer 6.
Figure 16B:
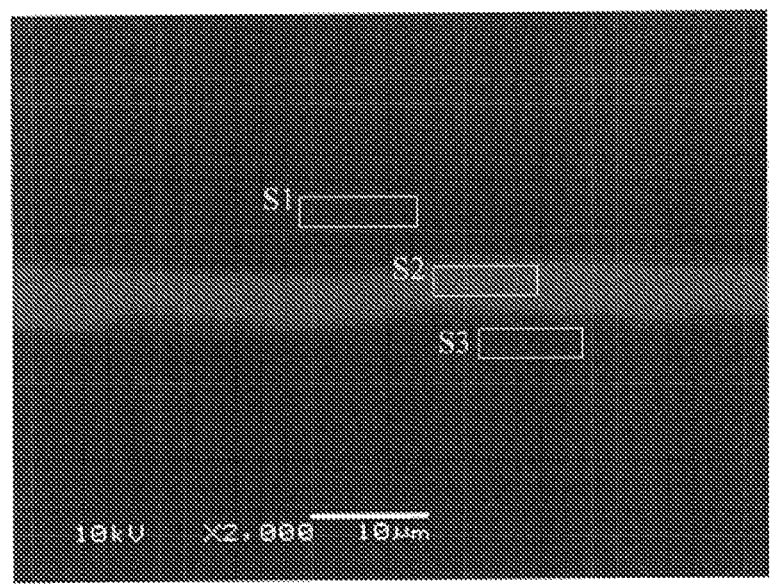

FIG. 16A and FIG. 16B are photographs of the cross-sectional plane in the vicinity of the bonding boundary between the connecting member 5 and the brazed bond layer 6. Here, the respective compositions of the connecting member 5 (area S1 in FIG. 16B), the brazed bond layer 6 (area S2 in FIG. 16B), and the terminal 3 (area S3 in FIG. 16B), were observed by "Electron Prove Micro Analysis with Energy Dispersive Spectrometer" (EDS-EPMA). Here, the thickness of the brazed bond layer including the area S2 in FIG. 16B was 5 µm.

Figure 17A:
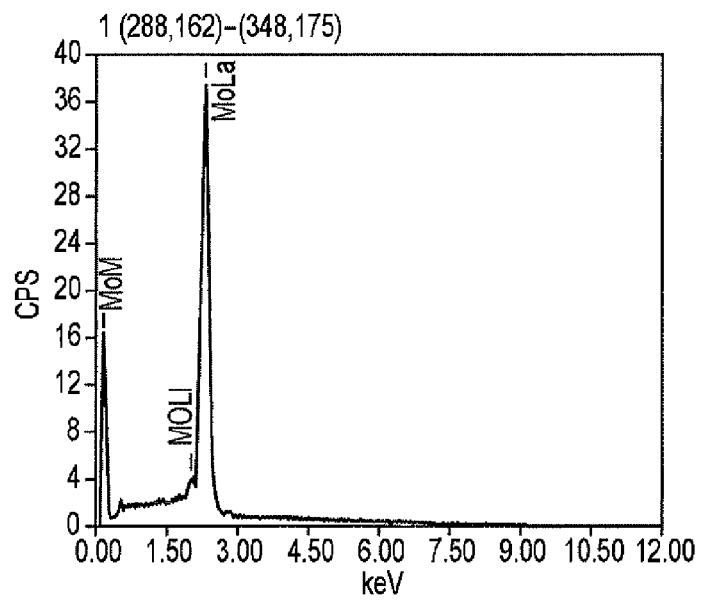
FIG. 17A is a view showing a result of element analysis in the vicinity of the bonding boundary between the connecting member 5 and the brazed bond layer 6, which is shown as an area S1 in the FIG. 16B.
Figure 17B:
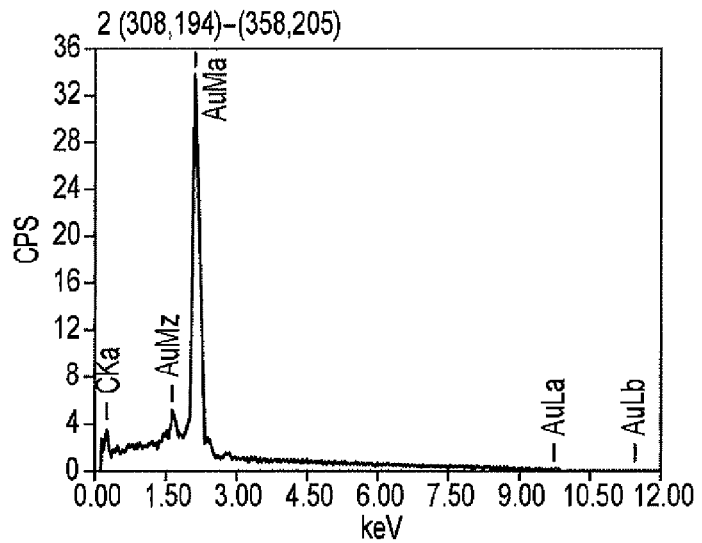
FIG. 17B is a view showing a result of element analysis of the brazed bond layer 6, which is shown as an area S2 in the FIG. 16B.
Figure 17C:
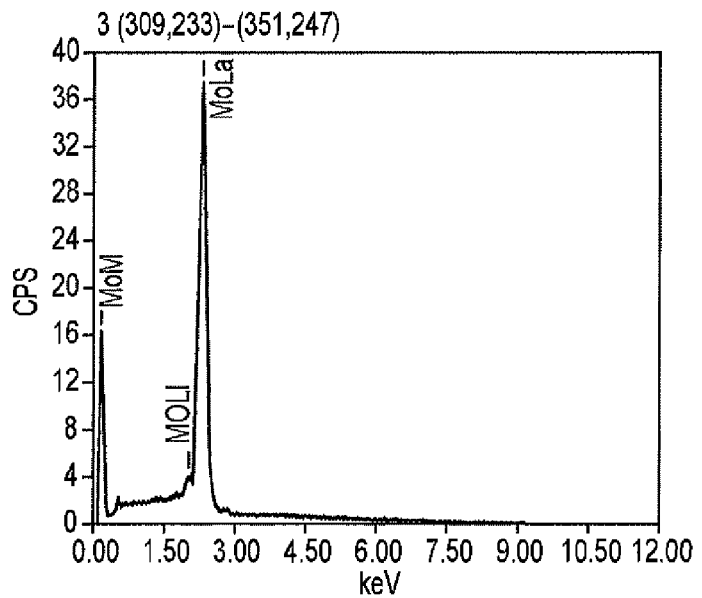
FIG. 17C is a view showing a result of element analysis in the vicinity of the bonding boundary between the brazed bond layer 6 and the terminal 3, which is shown as an area S3 in the FIG. 16B.

FIG. 17A shows a result of element analysis in the vicinity of the bonding boundary between the connecting member 5 and the brazed bond layer 6. FIG. 17B shows a result of element analysis of the brazed bond layer 6. FIG. 17C shows a result of element analysis of the terminal 3 in the vicinity of the bonding boundary between the brazed bond layer 6 and the terminal 3.

It was found that, as shown in FIG. 17A, the part of the connecting member 5 near the bonding boundary between the connecting member 5 and the brazed bond layer 6 is made mainly of molybdenum, and the gold of the brazed member was not diffused. In addition, it was found that, as shown in FIG. 17B, the brazed bond layer 6 is made of gold, and the molybdenum was not diffused. Moreover, it was found that, as shown in FIG. 17C, the terminal 3 was made of molybdenum, and the gold of the brazed member was not diffused.

As described above, it was confirmed that the brazed bond layer 6 was filled in the interstice between the terminal 3 and the connecting member 5 with no gap while not reacting on the terminal 3 or the connecting member 5, and that the brazed bond layer 6 exists in intimate contact with both the terminal 3 and the connecting member 5.

TABLE 2

| | | COMPARATIVE EXAMPLE 22 | EXAMPLE 10 | EXAMPLE 11 | EXAMPLE 12 | EXAMPLE 13 | EXAMPLE 14 |
|---|---|---|---|---|---|---|---|
| CONDITIONS | REFERENCE DRAWING | 15 | 1 | 5 | 11 | 12 | 13 |
| | CONNECTING MEMBER/SOLDER LAYER/TERMINAL | Mo/Au—Ni/Ni | Mo/Au/Mo | Mo/Au/Mo | Mo/Au/Mo | Mo/Au/Mo | Mo/Au/Mo |
| | CLEARANCE | ABSENT | PRESENT | PRESENT | PRESENT | PRESENT | PRESENT |
| | SOLDER POOL SPACE | ABSENT | ABSENT | PRESENT | PRESENT | PRESENT | ABSENT |
| | LOCKING PORTION | ABSENT | ABSENT | ABSENT | PRESENT | ABSENT | ABSENT |
| | RECESSED PORTION | ABSENT | ABSENT | ABSENT | ABSENT | PRESENT | ABSENT |
| | ANCHOR | ABSENT | ABSENT | ABSENT | ABSENT | ABSENT | PRESENT |
| TORQUE AT TORSIONAL BREAKAGE [N·M] | AFTER BONDING | 1.6 | 2.0 | 3.4 | 4.0 | 3.5 | 3.8 |
| | AFTER DURABILITY TEST | 1.6 | 1.8 | 3.4 | 3.9 | 3.6 | 3.8 |

REMARKS DURABILITY TEST: ALTERNATELY HEATING AT 200° C. AND 700° C. FOR 100 CYCLES

It is learned from reference example 22 and example 10 that the torsional breaking torque is enhanced when the clearance is formed. From examples 11 to 14, it is learned that providing the braze pool space and anchor in addition to the

What is claimed is:
1. A bonding structure, comprising:
a ceramic member made of aluminum nitride and including a hole formed therein;

a molybdenum terminal embedded in the ceramic member, said terminal including a surface exposed to a bottom surface of the hole;

a brazed bond layer contacting the exposed surface of the terminal, and consisting of gold;

a connecting member inserted in the hole, said connecting member including a body portion having a first predetermined diameter and an end portion having a second predetermined diameter that is smaller than the first predetermined diameter; and a relief space formed between the end portion of the connecting member and the hole of the ceramic member, wherein at least the end portion of the connecting member is bonded to the terminal via the brazed bond layer.

2. The bonding structure according to claim 1, wherein the end portion includes a bonding surface that contacts the bottom surface of the hole, the bonding surface of the connecting member and the bottom surface of the hole are substantially parallel to each other, the relief space formed between a side surface of the end portion and a side surface of the hole is larger than a space formed between a side surface of the body portion and the side surface of the hole, a diameter of the bottom surface of the hole is 1 to 1.5 mm larger than a diameter of the bonding surface when a diameter of the bonding surface is 4 mm to 6 mm, and a thickness of the brazed bond layer is 3 μm to 10 μm.

3. A semiconductor device manufacturing apparatus comprising the bonding structure according to claim 1.

* * * * *